(12) United States Patent
Nathanson et al.

(10) Patent No.: US 7,488,994 B2
(45) Date of Patent: Feb. 10, 2009

(54) COILED CIRCUIT DEVICE AND METHOD OF MAKING THE SAME

(75) Inventors: Harvey C. Nathanson, Pittsburgh, PA (US); Robert S. Howell, Silver Spring, MD (US); Garrett A. Storaska, Reston, VA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/861,885

(22) Filed: Jun. 7, 2004

(65) Prior Publication Data

US 2005/0013151 A1 Jan. 20, 2005

Related U.S. Application Data

(60) Provisional application No. 60/532,175, filed on Dec. 24, 2003, provisional application No. 60/476,200, filed on Jun. 6, 2003.

(51) Int. Cl.
*H01L 27/10* (2006.01)
(52) U.S. Cl. ............... 257/203; 257/315; 257/692; 257/693
(58) Field of Classification Search ............... 257/203, 257/315, 692, 693
See application file for complete search history.

(56) References Cited

U.S. PATENT DOCUMENTS

| | | | |
|---|---|---|---|
| 4,510,551 A * | 4/1985 | Brainard, II | ............ 361/684 |
| 6,051,877 A | 4/2000 | Usami et al. | |
| 6,183,267 B1 | 2/2001 | Marcus et al. | |
| 6,464,687 B1 | 10/2002 | Ishikawa et al. | |
| 2002/0018334 A1 | 2/2002 | Hill et al. | |
| 2002/0125545 A1 | 9/2002 | Kano et al. | |
| 2003/0057525 A1 | 3/2003 | Fock et al. | |

FOREIGN PATENT DOCUMENTS

| | | |
|---|---|---|
| CA | 2 305 069 A1 | 10/2001 |
| EP | 1 231 617 A1 | 8/2002 |
| EP | 1 241 507 A2 | 9/2002 |
| EP | 1 241 507 A3 | 9/2002 |
| JP | 6-125153 * | 5/1994 |
| WO | WO 01/81173 A1 | 11/2001 |
| WO | WO 01/88612 A2 | 11/2001 |
| WO | WO 02/36486 A | 5/2002 |

OTHER PUBLICATIONS

Celler, G.K., Cristoloveanu, S., Frontiers of silicon-on-insulator, J. Applied Physics, May 1, 2003, 4955-4978, vol. 93 No. 9.
Gill, John J., Chang, David T., Momoda, Leslie A., Carman, Greg P., Manufacturing issues of thin film NiTi microwrapper, Sensors and Actuators A, Elsevier Sequoia, S.A., Lausanne, Ch., Sep. 30, 2001, 148-156,vol. 93, No. 2.
International Search Report, PCT/US2004/017952, Jul. 6, 2004.
Written Opinion, PCT/US2004/017952, Jul. 6, 20046.

* cited by examiner

*Primary Examiner*—Thien F Tran
(74) *Attorney, Agent, or Firm*—Rothwell, Figg, Ernst & Manbeck, P.C.

(57) ABSTRACT

A coiled circuit device is produced by forming a circuit layer on a substrate. Optional insulator layers may be disposed above and below the circuit layer. The circuit layer, which may be memory, control, or other circuitry, is released from the substrate such that it coils into a dense, coiled device. A stressed coiling layer may be included which effects coiling when the circuit layer is released.

24 Claims, 43 Drawing Sheets

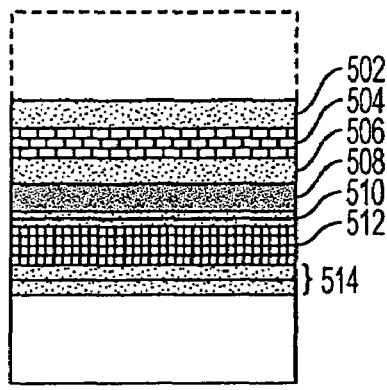
FIG. 5E
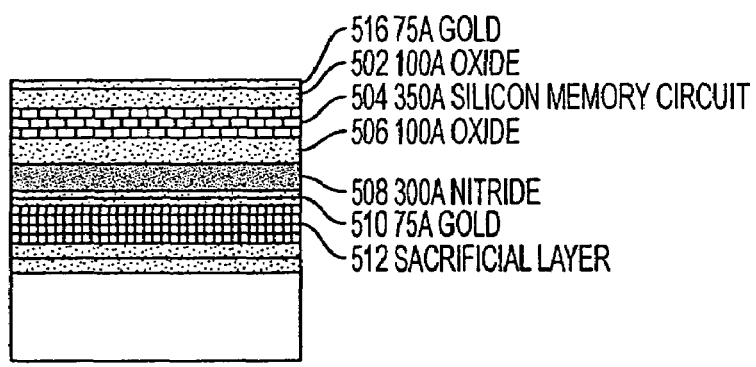
FIG. 5F
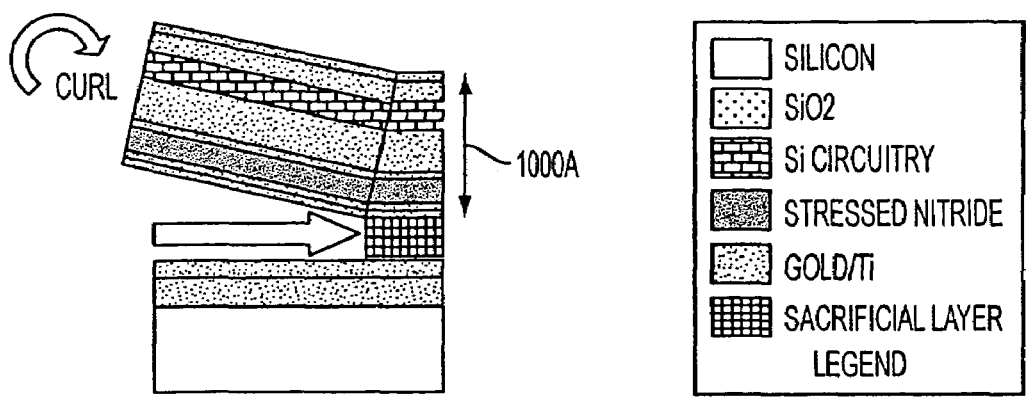
FIG. 5G
FIG. 5H

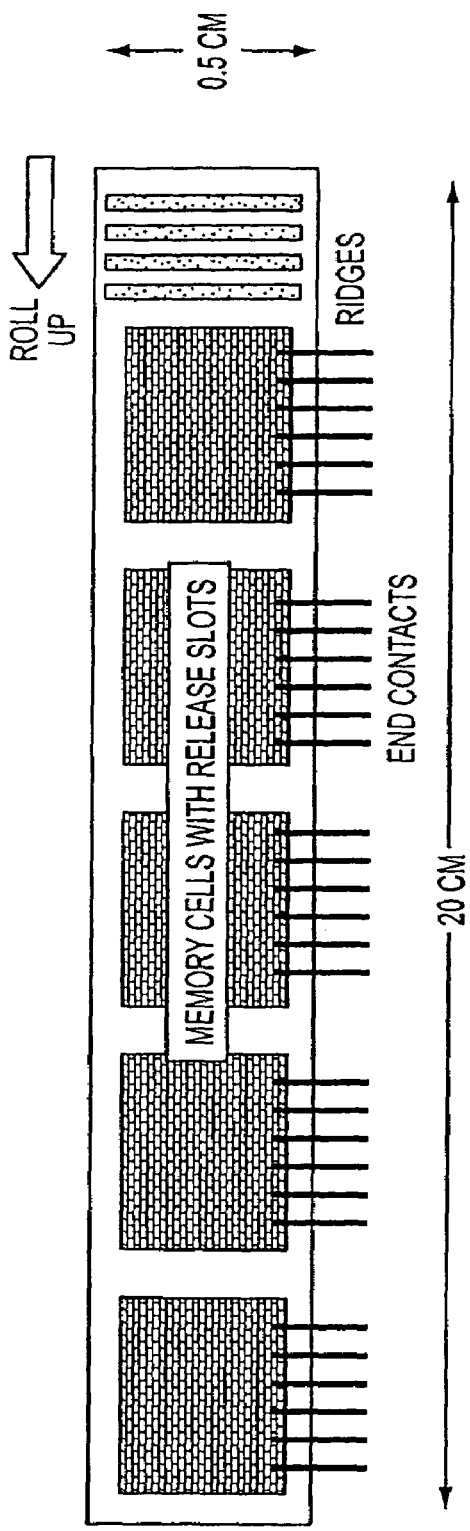
FIG. 24A
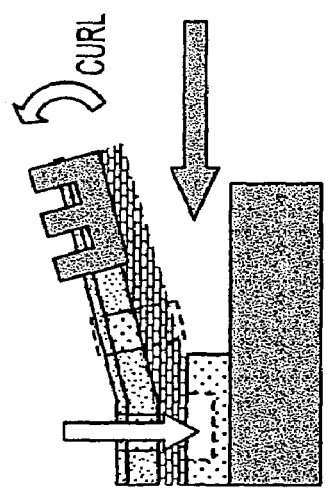
FIG. 24B
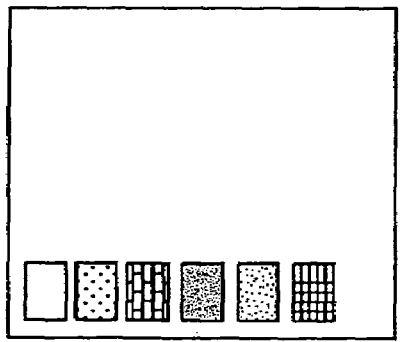

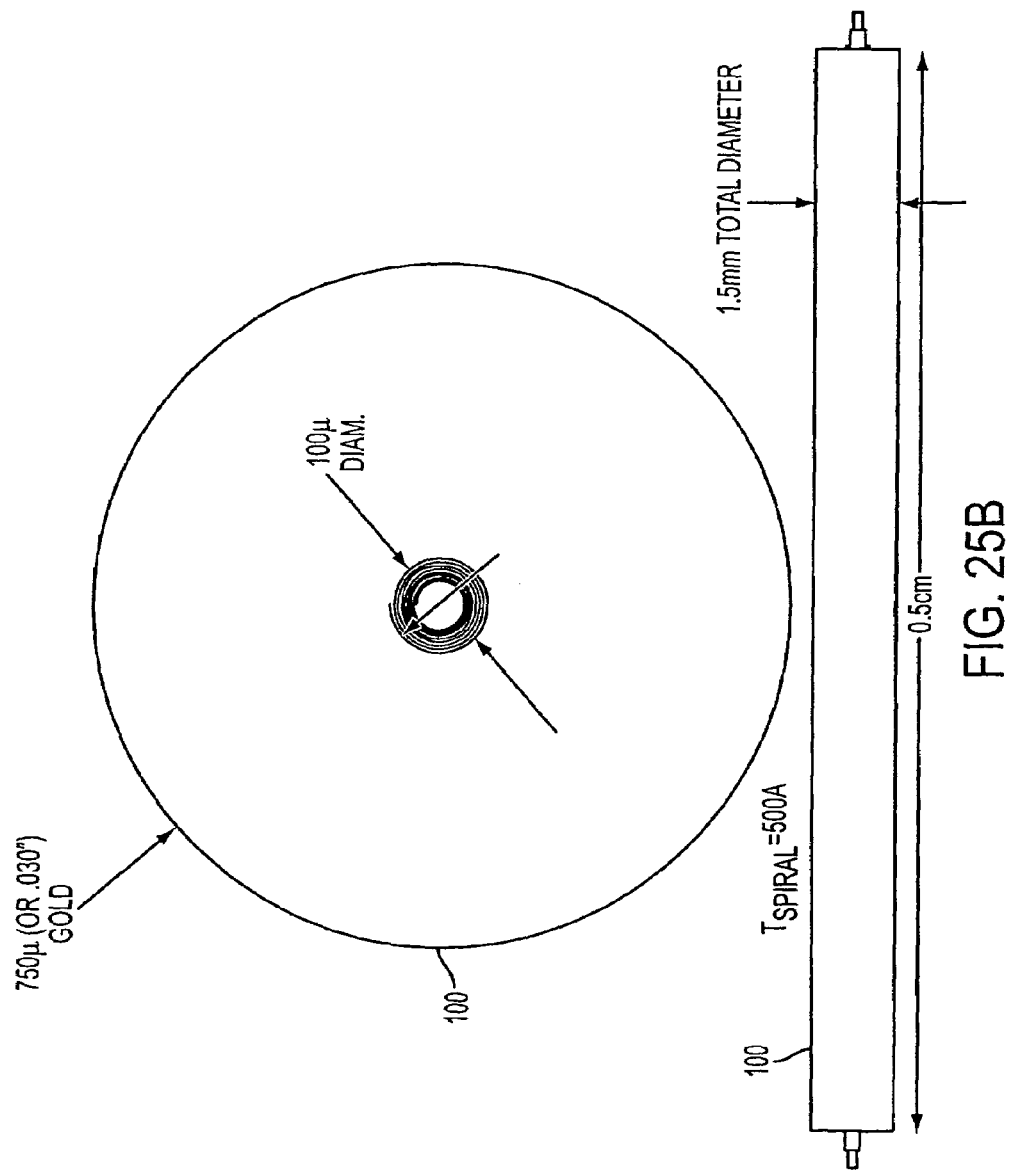

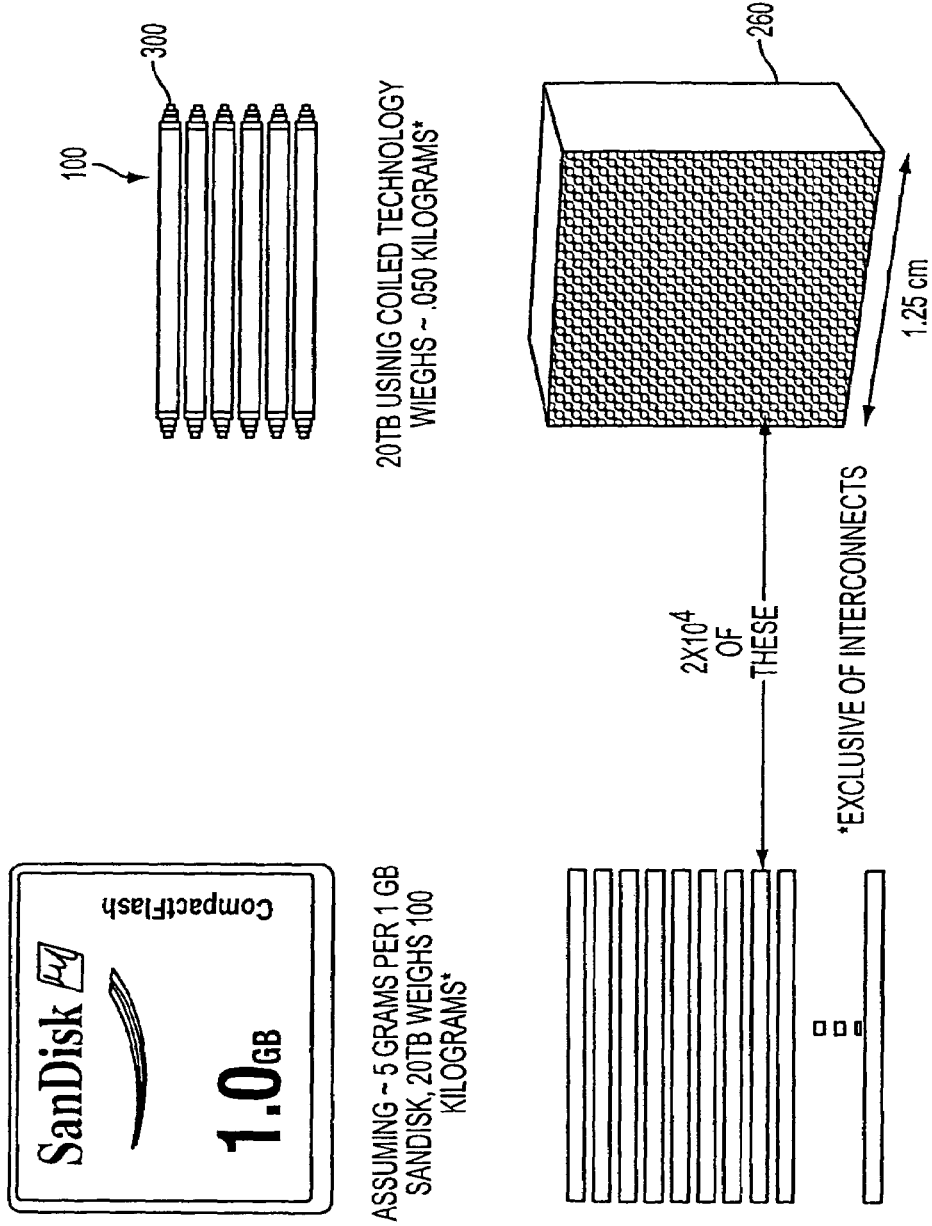

*WILL NEED BETTER THAT 5 TO10 lp/mm XRAY EQUIVALENT RESOLUTION AT SCREEN TO SEE THIS NANOMEMORY

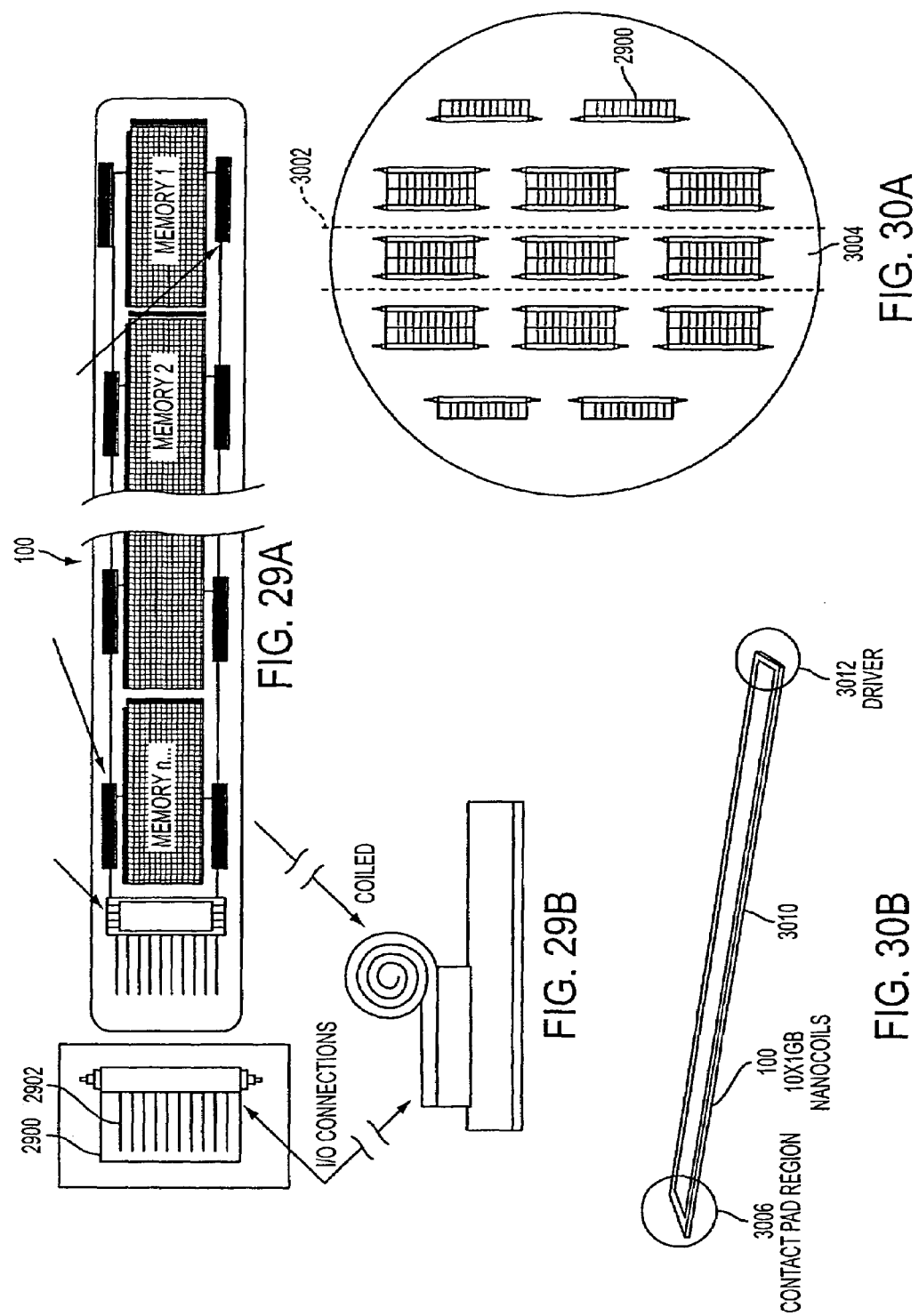

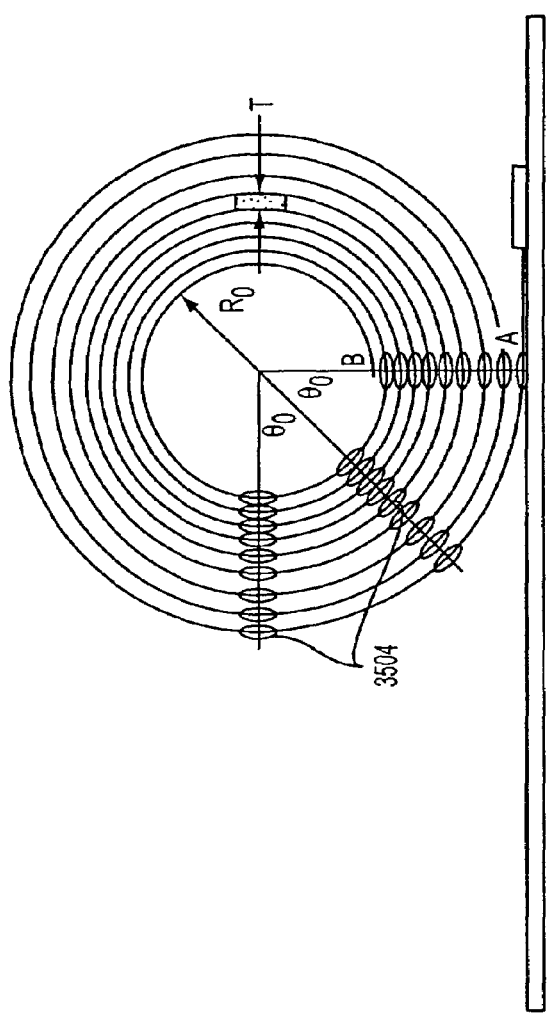
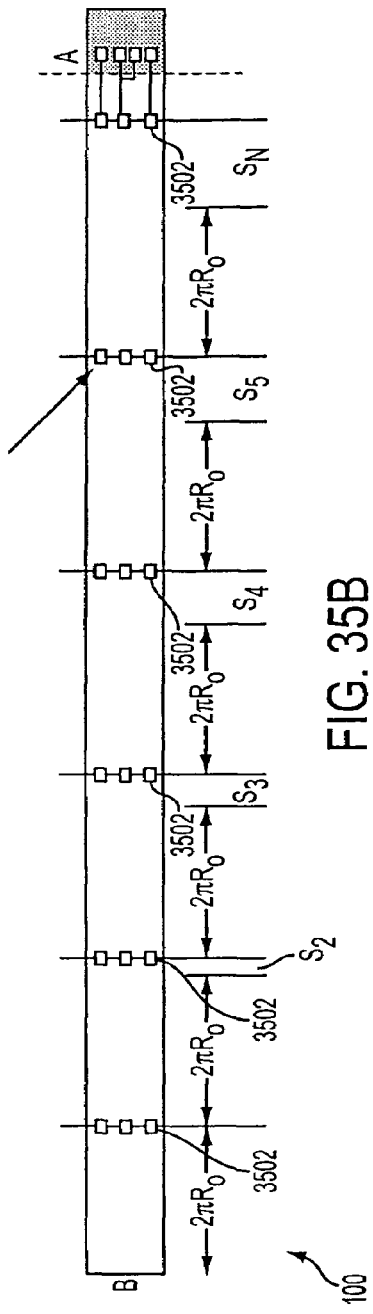
FIG. 35A
FIG. 35B

| TECHNOLOGY | SURFACE-TO-VOLUME RATIO $S_v$ (cm-1) | SIZE OF A BIT $A_B$ (cm2) | CHARACTERISTIC R/W TIME PER I/O LEAD TAU (sec) | DENSITY-SPEED PRODUCT FIGURE OF MERIT= $S_v/(A_B \times TAU)$ BITS/(cm3 X SEC) |
|---|---|---|---|---|
| MAGNETIC DISC | 40 | 5E-9 | 1E-3 | 8E12 |
| FLASH SEMICONDUCTOR (CONVENTIONALLY-PACKAGED) | 100 | 1.1E-9 | 1E-7 | 9E17 |
| FLASH SEMICONDUCTOR (NANOCOIL) | 50000 | 1.1E-9 | 1E-7 | 4.5E20 |
| FLASH SEMICONDUCTOR ASSUMING CARBON NANO TUBE MOS 'PACKAGING' | 400000 | 1.5E-10 | 1E-7 | 2.6E22 |

FIG. 37

COILED CIRCUIT DEVICE AND METHOD OF MAKING THE SAME

RELATED APPLICATION DATA

This application claims priority under 35 U.S.C. § 119(e) to U.S. Provisional application No. 60/476,200, filed on Jun. 6, 2003 (the "'200 application"), and to U.S. Provisional application No. 60/532,175, filed on Dec. 24, 2003 (the "'175 application"), both of which are incorporated herein by reference in their entirety.

BACKGROUND OF THE INVENTION

1. Field of the Invention

The present invention is generally directed to integrated circuits and memory circuitry. More particularly, the present invention is directed to novel coiled circuit devices and methods for making the same.

2. Description of the Related Art

The dawn of the information age has significantly increased the need for electronic data storage. Portable electronic devices, such as digital cameras, digital camcorders, laptops and other similar products have become ubiquitous. It is desired that such devices have large memory capacities, yet it is also desired that such devices be easier to carry, and therefore, be as small and light as possible. Such devices have a need for enormous amounts of compact, portable and low power memory to store high quality images, applications, etc. As a result, there is a practical need for improved memory devices that are more capable, smaller and less expensive than current memory devices.

Additionally, pioneering industries, such as aerospace technologies, require increasingly more capable electronic devices that are also smaller and lighter in weight. Furthermore, space and other applications may require additional shielding, which substantially adds to the overall weight. Conventional memory circuits can be too large and bulky for such applications. Accordingly, dense memory technologies are evolving that push the limits of size, speed and capacity. Thus, there is a continued need for new and improved memory devices. There is a similar need for new circuit devices that have improved size, speed and capacity.

SUMMARY OF THE INVENTION

The present invention is a monumental improvement upon the prior art. According to embodiments of the present invention, information density may be improved on the order of 1000-10,000 times the information density defined as active device area per volume over the prior art.

The present invention includes a circuit layer that is coiled (or "curled") into a cylindrical form and methods for making the same. Coiled circuitry has exceptional volume and weight characteristics when compared to conventional circuitry. A number of exemplary and preferred embodiments of coiled devices and methods for fabricating the same are disclosed below.

In accordance with an embodiment of the present invention, a coiled circuit device is produced by a process comprising the steps of forming a circuit layer onto a substrate and releasing the circuit layer such that it coils.

In accordance with an embodiment of the present invention, a method of fabricating a coiled circuit device is provided. The method includes steps of forming a circuit layer onto a substrate, wherein the circuit layer comprises at least one circuit, and releasing the circuit layer such that it coils.

In accordance with one embodiment of the present invention, a coiled memory device may include a sheet of memory that is coiled. The sheet may include a memory circuit layer, an insulator layer, a coiling layer, and outer ground insulator layers.

The memory circuit layer can be conventional silicon on insulator (SOI) memory. Preferably, the memory circuitry is thin-CMOS SOI memory. Furthermore, the memory circuit layer can include related circuitry such as read/write access circuitry (e.g., drivers). The insulator layer is preferably silicon oxide. The coiling layer is chosen to effect curling/coiling during fabrication, and is preferably selected from a material having different temperature volume characteristics (i.e., Coefficient of Thermal Expansion (CTE)) than the circuit layer. Preferably, stressed silicon nitride can be included in the sheet as the coiling layer.

The memory circuit layer of the sheet may include a number of discrete memory circuits depending on the size of the sheet. Electrical contacts may be formed onto edges of the circuits or of the sheet to provide data retrieval, command and/or control of the memory circuits. The electrical contacts can be a pad, extensions, plated thru contacts, or other suitable contacts. Electrical extension-type contacts may be of different lengths (i.e., extending a different length away from memory circuits) to provide better connectability. According to one embodiment, the contacts are provided having progressively longer lengths as they are disposed along the periphery from one end of the sheet to the other, such that when the sheet is coiled, the contacts form a co-axial pyramid like contact group at one or both ends of the coil.

According to a preferred embodiment of the present invention, the sheet includes a first ground insulator such as gold, a nitride coiling layer, a first oxide layer, a memory layer, a second oxide layer, and a second ground insulator layer. Preferably, the sheet is approximately 10 cm long, 5 mm wide and 1000-1500 angstroms thick. To achieve the desired thickness, thin CMOS technology is preferably utilized to fabricate the SOI memory layer. Preferably, the grounding layers are approximately 75 angstroms thick, the oxide layers are approximately 100 angstroms thick, and the nitride layer is approximately 300 angstroms thick. This preferred configuration can provide 1 gigabyte or more of memory capacity in a device about the size of an eyelash or hair.

The speed of writing and reading of conventional memory may be maintained by utilizing thin X-Y address conductors, and by additionally fabricating the thin X-Y address conductors out of metal (e.g., 25 angstroms gold) to keep the X-Y line resistance acceptably low.

According to another embodiment of the present invention, a method is provided for fabricating a coiled memory device. The method preferably includes a step of fabricating a memory circuit, preferably an SOI memory circuit, onto a wafer, e.g., by conventional means. A number of layers are deposited onto the memory circuit, which may include: an oxide layer, a nitride layer, a thin gold layer, a sacrificial layer, and a bonding oxide layer. The wafer is flipped and bonded onto a second wafer, which can also include a bonding oxide layer. The combined wafer can be etched and/or ground down (i.e., planarized) from the top to the oxide insulating layer (now above the memory circuit layer). A second thin gold layer may be deposited on the insulating layer of the SOI memory circuit. The sacrificial layer is then, preferably undercut from one end, allowing the layers above it to coil. The sacrificial layer may be undercut by any appropriate means. For example, the wafer may be lowered into an etching solution at a rate permitting the device to coil.

According to another embodiment of the present invention, a coiled silicon circuit device is provided which has a density speed product of at least $1 \times 10^{20}$ bits per cubic centimeter seconds.

Further applications and advantages of various embodiments of the present invention are discussed below with reference to the drawing figures.

BRIEF DESCRIPTION OF THE DRAWINGS

FIGS. 5b-5i illustrate steps of the method of FIG. 5a;

FIG. 24 illustrates a process for fabricating the nanocoil device utilizing ridges at the beginning of the coil according to an embodiment of the present invention;

FIGS. 25a-b show high-radiation applications of the present invention including shielding;

FIGS. 26a-b show a memory cube constructed from a plurality of coiled memory devices;

FIG. 29 shows a device having a pad type contact before and after coiling according to an embodiment of the present invention;

FIG. 30 shows a wafer with multiple nanocoil devices fabricated thereon and a corresponding device stick after coiling;

FIGS. 35a-b illustrates a contact scheme in which solder bumps are formed in the device which line up during coiling and provide direct address lines through the diameter of the coil according to an embodiment of the present invention;

FIG. 37 is a chart comparing various technologies with the present invention in terms of speed and density of devices.

DETAILED DESCRIPTION OF THE PREFERRED EMBODIMENTS

In standard planar semiconductor processing techniques, information density is achieved by scaling down the transistor gate lengths and therefore the device foot print. This allows the devices to be packed in to active area/volume (surface-to-volume ratio) device densities of at most 100 cm$^{-1}$. However with standard processing, the active area of the device is typically only a few thousand angstroms in depth, and therefore, the substrate thickness of approximately 100 μm needed for mechanical support, is largely wasted volume.

With the present invention, we can achieve on the order of 1000-10,000 times the information density defined as active device area per volume. This is obtained by skimming of the active area from the surface of the wafer and allowing build-in stressed layers to self-coil the device several hundreds of times in order to maximize active device volume density. Furthermore, while the packing of the devices are substantially different than conventional planar devices the fundamental semiconductor processes to fabricate the devices and physical operating mechanism is the same. Therefore, the density achievements of ×10,000 can be achieved without significant loss in the device read frequency. The pioneering NanoCoil technology will allows us to project future flash memory sized cards of approximately 2-3 cm$^3$ will be capable 10TB of memory capacity compared to the present day 1 GB, while still achieving read frequencies of 0.1-1 μs.

Figure 1:
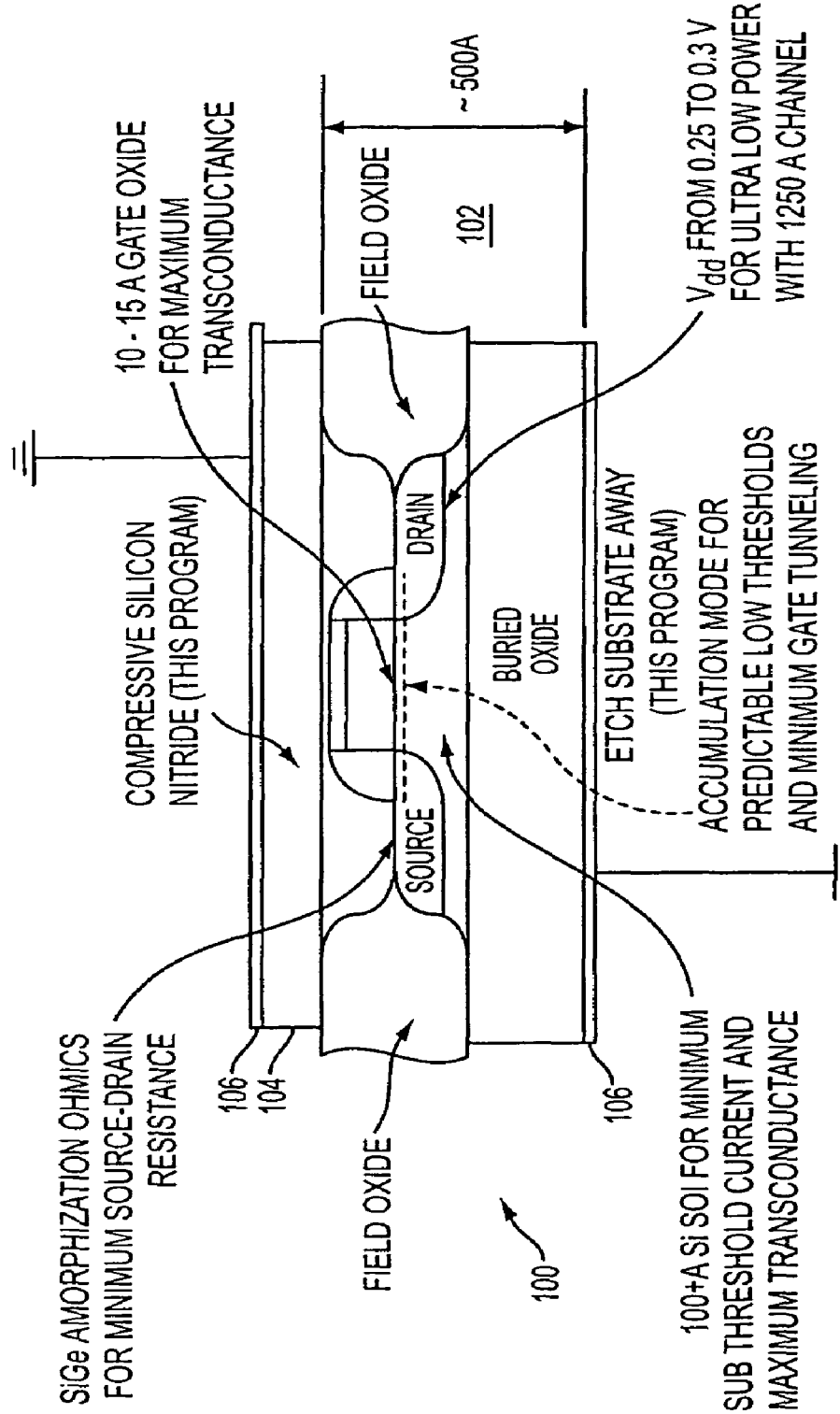
FIG. 1 shows a side view of a memory sheet which can be curled into a coiled memory according to an embodiment of the present invention.

FIG. 1 is a side view of an exemplary memory device which can be coiled (see, e.g., FIGS. 2-3) according to the present invention. The device 100 includes a memory circuit layer 102, a coiling layer 104, and outer ground layers 106. The memory circuit layer 102 may include conventional memory circuitry and is preferably thin SOI MOS technology. The coiling layer 104 is included in the device to facilitate coiling of the device and is preferably composed of compressive silicon nitride. The ground layers are prevent cross talk between layers after coiling and preferable include a good conductor, such as copper, gold or aluminum. If ground layers are used, then a barrier layer of a dielectric material should be formed between the circuit layer and the ground layers. Further, nitride is known to capture a charge and therefore, an insulator may be helpful in reducing the effects a nitride layer may have upon the circuit layer.

Exemplary thin MOS memory circuit technology is described in co-owned, co-authored U.S. Pat. No. 5,969,385 entitled, "Ultra-low Power-Delay Product NNN/PPP Logic Devices," the complete contents of which are incorporated herein by reference. Some non-limiting features of thin MOS technology can include: 100+ angstrom Si, SOI for minimum sub-threshold current and maximum transconductance; an Accumulation Mode for predictable, low thresholds and minimum gate tunneling; 10-15 angstrom gate oxide for maximum transconductance; and SiGe amorphization ohmics for minimum source-drain resistance.

Only a portion of device 100 is shown in FIG. 1, however, as is described in further detail below, circuitry can be fabricated onto wafers in sheets or strips (see, e.g., FIGS. 2-3), and then is coiled or curled by a number of different curling processes. Therefore, reference is made to device 100 as a "sheet" though out this document. Thin MOS technology allows a workable geometry for the present invention and the creation of suitable sheets of memory; however, the invention is not intended to be limited to thin MOS technology, and one skilled in the art will understand that other circuit designs may be coiled according to the present invention. Further, reference throughout this document is made to memory circuits and memory sheets, however, the invention is not limited to solely memory. However, since memory design is simple and well known, it is therefore helpful for illustrative purposes.

The speed of writing and reading of conventional memory can be maintained by utilizing thin X-Y address conductors. By additionally fabricating the thin X-Y address conductors out of metal (e.g., 25 angstroms gold), the X-Y line resistance can be kept acceptably low. In order to achieve a very small device volume, a tight coil is sought. As a result, very thin insulator layers are preferably used to achieve tight curling, which compounds the need for low resistance. Thin oxides and thin metal lines give RC read/write time-constants that are not much different than conventional fast memory, and yet allow the ability to wind the memory device into a tight coil.

Each of the layers of the sheet 100 is fabricated such that the total thickness of the sheet 100 is preferably between approximately 1000 and 1500 angstroms (A). Of course, the coiled memory device can be made larger or smaller in order to achieve the desired volume, speed and capacity.

Figure 2:
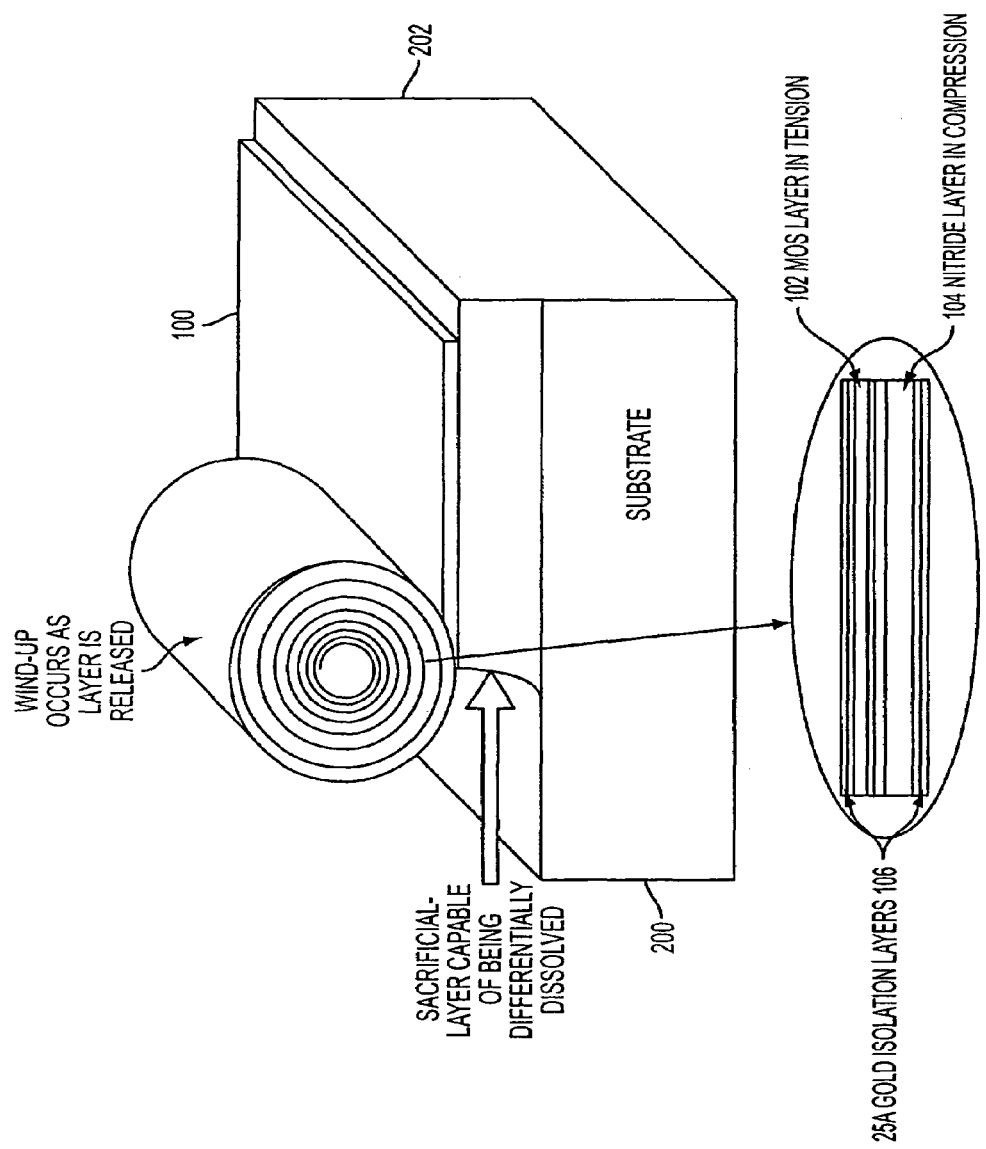
FIG. 2 is a perspective view of a memory sheet for a coiled memory device, according to an embodiment of the present invention.

FIG. 2 illustrates coiling of a memory sheet 100 according to an embodiment of the present invention. Sheet 100 is fabricated onto a wafer or substrate 200, and on top of a sacrificial layer 202. As shown, the sacrificial layer 202 is gradually removed, during which the coiling layer 104 forces the memory sheet 100 to coil. Preferably, coiling layer 104 is in compression while the memory layer 102 is in tension. The silicon MOS layer 102 contracts during cooling at a different rate than the coiling layer 104, from the original coiling layer deposition temperature to room temperature, forcing the sheet 100 to coil. The sacrificial layer 202 can be gradually removed until the sheet 100 is completely coiled into a substantially cylindrical shape. As will be discussed in further detail below, the device may be fabricated to adjust the radius of coil.

Figure 3:
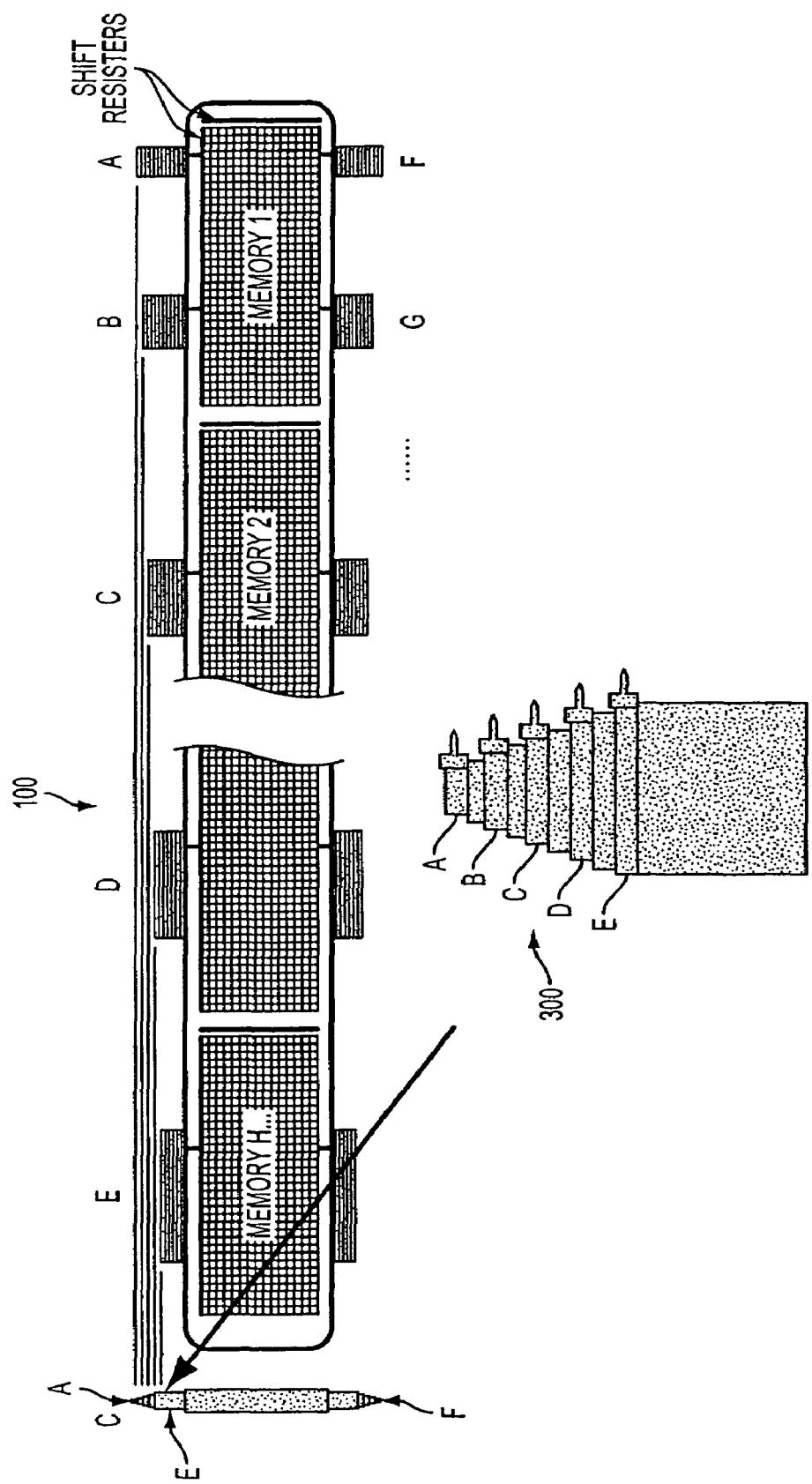
FIG. 3 is a top view of a memory sheet according to an embodiment of the present invention.

FIG. 3 is a top view of the sheet 100, which can include electrical contacts (100A-E) attached to each memory circuit. As shown, sheet 100 can include a number (n) of discreet memory circuits each designed and fabricated appropriately according to desired memory performance. Each circuit can have n numbers of electrical contact circuits 100A-E(n), for data retrieval and command/control of the memory circuit. Driver circuitry may be included on the sheet 100 or may be fabricated separately.

The contact circuits 100A-E (also referenced generally herein as "contacts") may be conventionally fabricated and can have different lengths and widths, so as to be more easily accessible once the sheet 100 is coiled. Accordingly, as shown, top contact circuits A-E are progressively shorter and wider respectively. As a result, the contact circuits A-E form a convenient pyramid type contact section 300 when sheet 100 is coiled. Note that physical contacts (contactors) may be side contacts as shown projecting from each contact circuit, or other physical contact means may be used. The contacts may be spaced according to known standards for connections, such as for PCI/CIA cards.

Figure 4A:
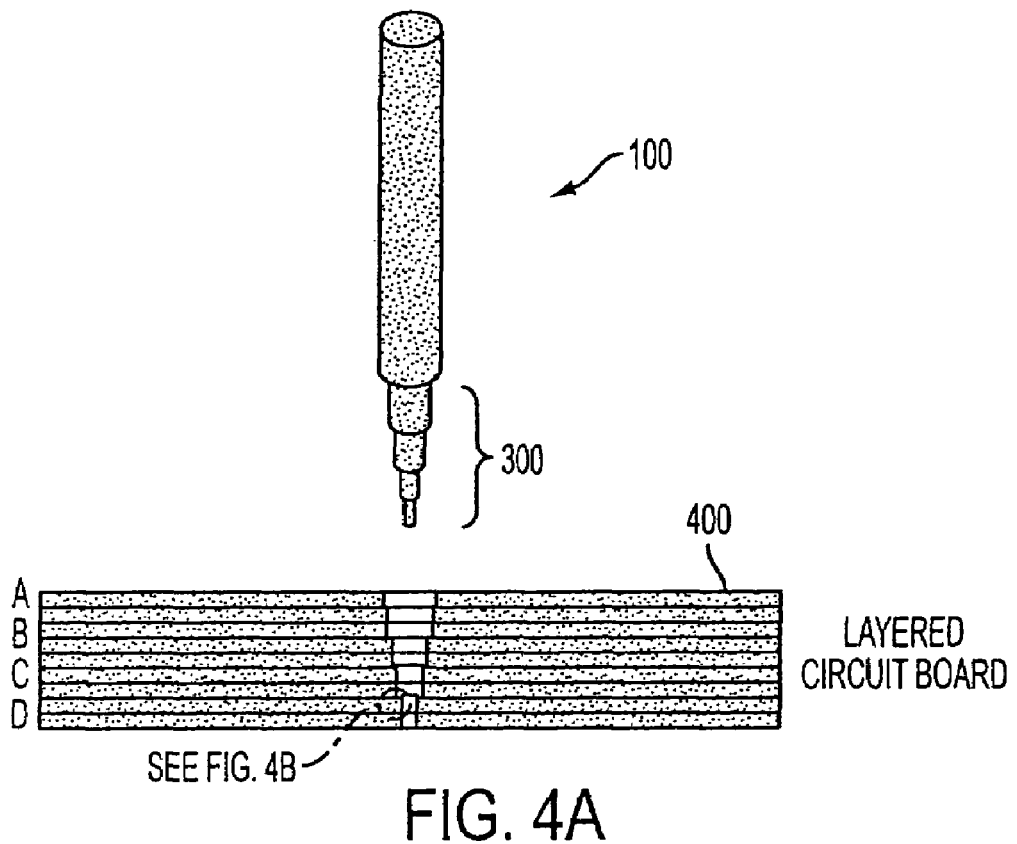
FIG. 4 illustrates a coiled circuit device being inserted into a layered circuit board according to an embodiment of the present invention.
Figure 4B:
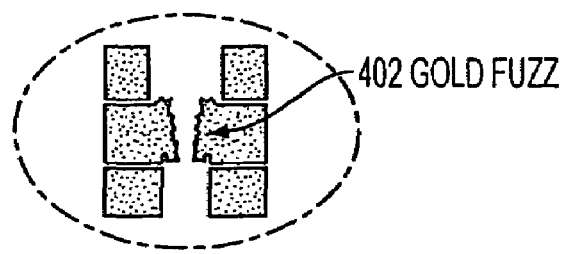

FIG. 4 illustrates a coiled circuit having a contact scheme like that shown in FIG. 3 being inserted into a layered circuit board 400 for use in an application. Using the example of FIG. 3, the layered circuit board 400 may include a separate circuit layer 400A-E(n) (E not shown) for each discreet memory circuit within sheet 100, or for a plurality of memory circuits. Gold fuzz contacts 402 (see exploded view) can be used to provide adequate electrical contact to each contact circuit 300 A-E. Other contact means are also contemplated.

Figure 5A:
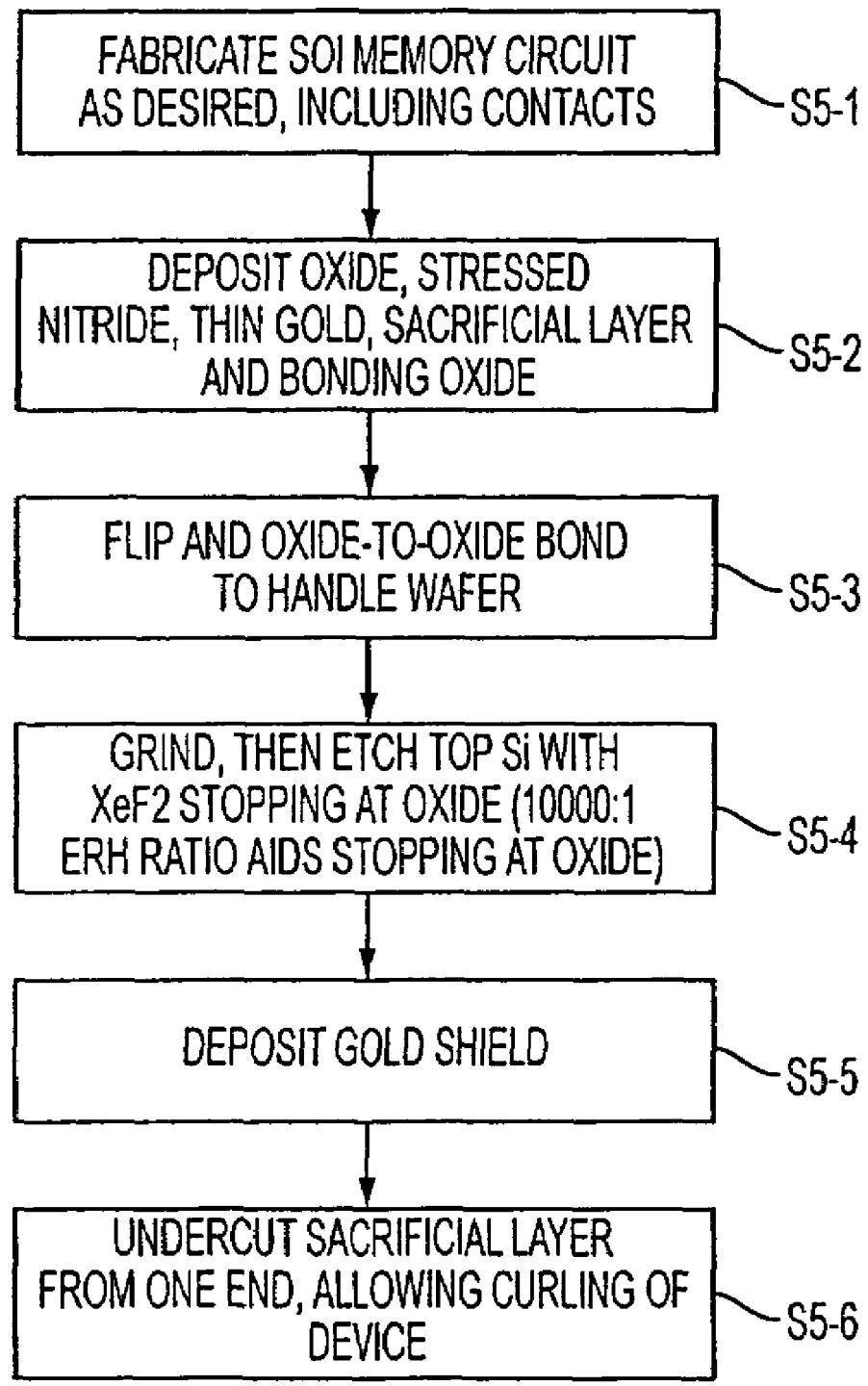
FIG. 5a is flow chart of a method of manufacturing a coiled circuit device according to a preferred embodiment of the invention.
Figure 5B:
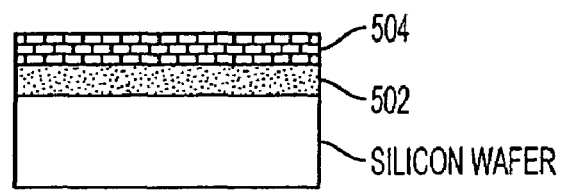
Figure 5C:
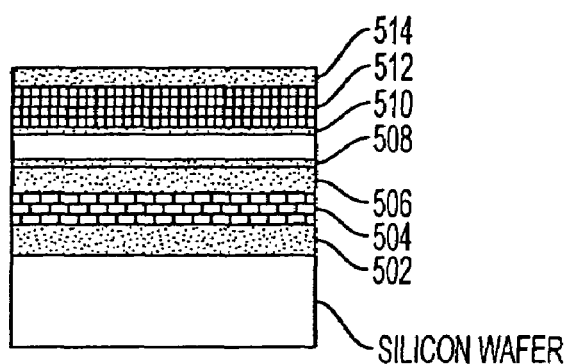

FIG. 5a is a flow chart of a method for fabricating a coiled memory circuit, according to an embodiment of the present invention. Each step of the method is illustrated in FIGS. 5b-5g. Individual layers are shown using different patterns, which are also identified by a legend in FIG. 5h. The legend is not intended to limit the invention and merely sets forth exemplary materials. First (FIG. 5b), in step S5-1, a SOI memory circuit (504) is fabricated as desired on a silicon wafer, and may include electrical contacts (not shown). The SOI memory circuit layer (504) is preferably thin MOS technology comprising a 350 angstrom (approximately) silicon memory circuit on a 100 angstrom (approximately) silicon oxide layer (502). At step S5-2, a 100 angstrom (approximately) silicon oxide layer 506 is deposited on the memory layer 504, a 300 angstrom (approximately) thick layer of nitride (508) is next deposited at an elevated temperature to serve as a coiling layer, a 75 angstrom thick (approximately) thin gold layer (510) is deposited onto the coiling layer, a 500 to 1000 angstrom thick (approximately) sacrificial layer (512) is deposited onto the thin gold layer, and a bonding oxide layer (514) is deposited onto the sacrificial layer. The resulting wafer is shown in FIG. 5c.

Figure 5D:
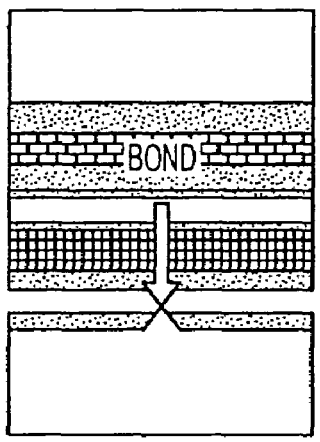
Figure 51:
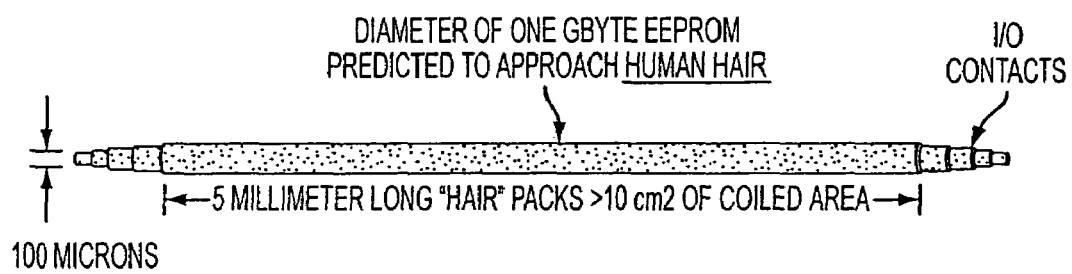

At step S5-3, the wafer is flipped and bonded to another wafer, preferably by an oxide-to-oxide bond, as shown in FIG. 5d. At step S5-4, the top layer of silicon substrate is ground-down (e.g., mechanically) and etched to the oxide layer (502) of the memory device, as shown in FIG. 5e. At step S5-5, a second thin gold layer (516) having the same thickness as the first thin gold layer is deposited onto the surface of the oxide layer (502), as shown in FIG. 5f.

It is believed that the difference between the coiling layer high deposition temperature and the final operational temperature of the nitride/silicon layers causes coiling, due to the difference in the Coefficients of Thermal Expansion (CTE)

between the nitride and the device/circuit layers (described in further detail below). Thus, the sacrificial layer is then undercut, from one end in step S5-6 to cause the memory device to curl, as shown in FIG. 5g. As a result, a coiled memory device having a high memory per volume density can be provided, shown in FIG. 5h.

Coiling or curling of the device is shown and described herein as resulting in a coiled device, which may be in a cylindrical form. However, the invention is not intended to be restricted to cylinder-type shapes. One will understand that other geometries can result form the coiling process, such as square or octagonal geometries, for example. Therefore, reference to "coiling" or "coiled" throughout this document is intended to cover other geometries than cylindrical.

In FIG. 5f, the sheet has a thickness of approximately 1000 angstroms. As a result, a 1-gigabyte (GB) memory device can be coiled into, e.g., a ~0.00005 cubic cm memory coil (see FIG. 5i). The coiled device has a tremendous advantage over the prior art because of its resulting shape and volume. As will be explained in further detail below, various configurations and techniques may be employed to combine a plurality of coiled devices into a single device to create a super-dense memory device or integrated circuit.

Figure 6:
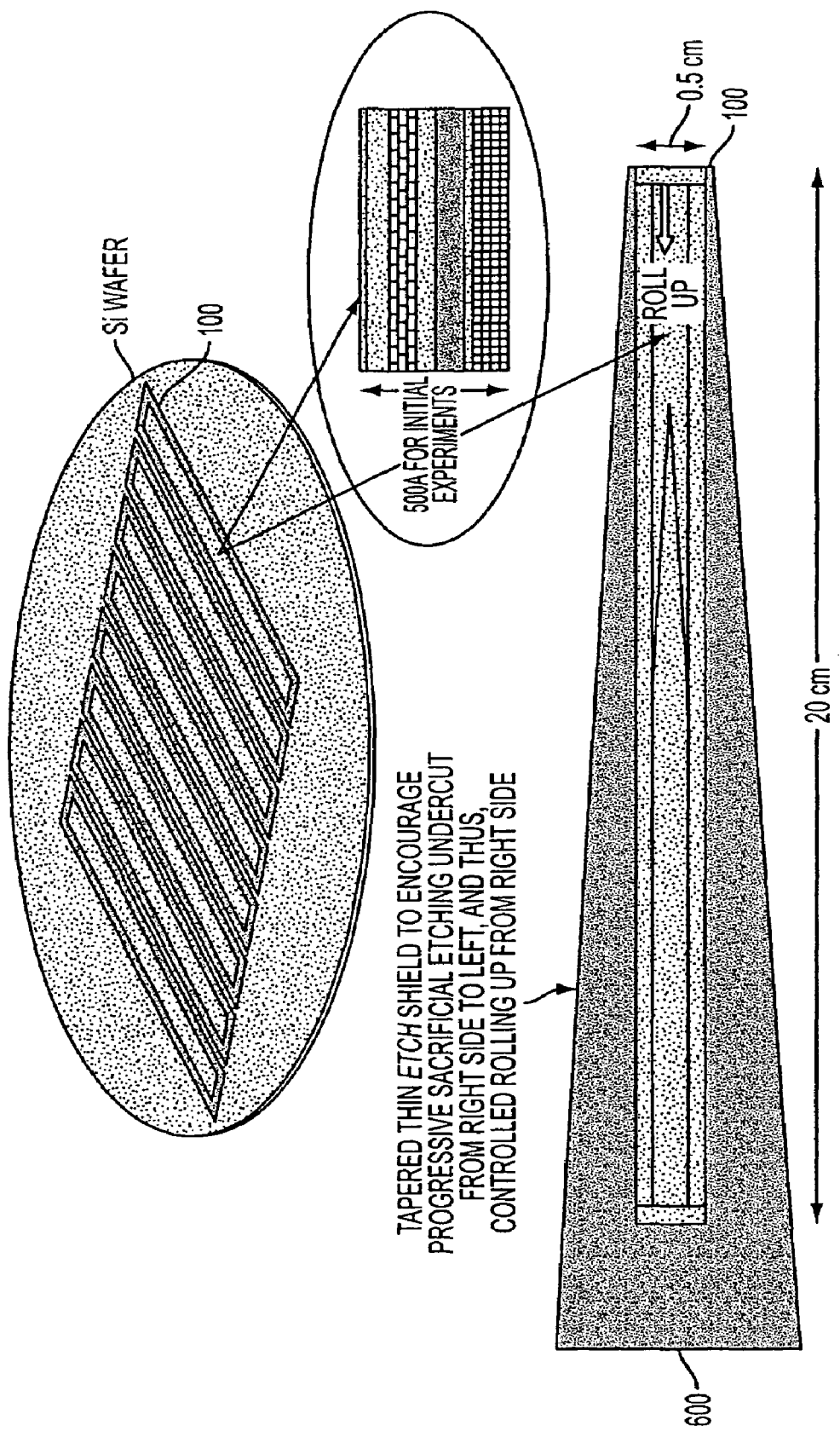
FIG. 6 shows a memory sheet having an etch shield disposed thereon, according to an embodiment of the present invention.

A number of techniques are contemplated for undercutting the sacrificial layer to achieve a tight coil. One embodiment of a process of removing the sacrificial layer and coiling the circuit sheet 100 includes a step of adding a temporary tapered etch shield to encourage progressive sacrificial etching from one end. FIG. 6 shows a 20 cm memory circuit sheet 100 having an etch shield 600 tapered from right to left. As the sacrificial layer is undercut, the etch shield 600 controls the rolling up of the sheet 100, causing coiling from the narrow end (right end) to the thicker end (left end), and prevents the corners of circuit sheet 100 from curling. Etching may be, e.g., wet etching or dry etching.

The etching shield may be adjusted in size and shape to achieve the desired effect. For example, the etching shield may be designed to prevent curling entirely at a certain point, in order to hold the coiled memory device to the wafer.

In fact, the sacrificial layer may not be necessary and the circuit layer may be released by other means. For example, an implantation process may be used to cleave the circuit layer off. An exemplary dry release process is described in further detail below with reference to FIG. 36.

Also, as shown in the upper portion of FIG. 6, multiple sheets 100 may be fabricated on a single wafer.

Figure 7:
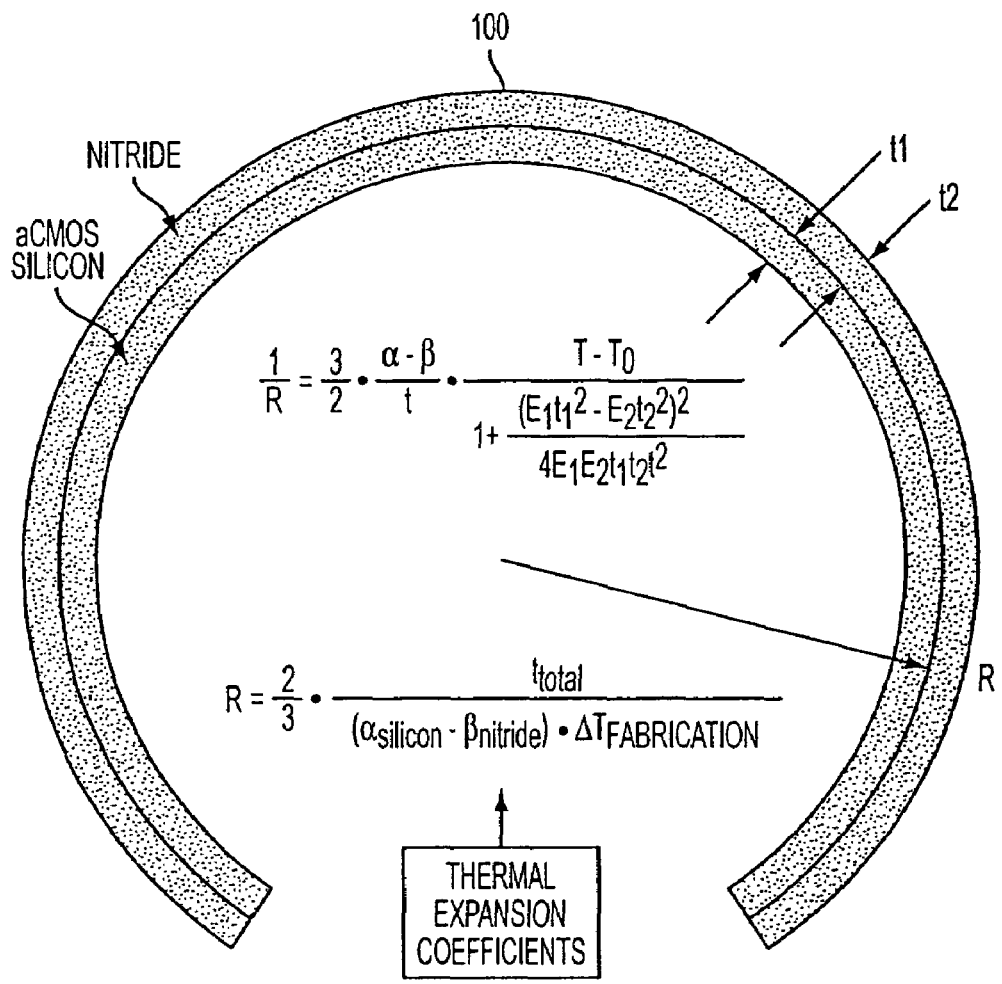
FIGS. 7 and 8 show cross sectional views of a coiled memory device according to an embodiment of the present invention.

Referring to FIG. 7, the radius of the inside winding of the coil can be calculated from the formula:

$$\frac{1}{R} = \frac{3}{2} \cdot \frac{\alpha - \beta}{t} \cdot \frac{T - T_0}{1 + \frac{(E_1 t_1^2 - E_2 t_2^2)^2}{4 E_1 E_2 t_1 t_2 t^2}}$$

Where $\alpha$ and $\beta$ are the thermal expansion coefficients of silicon and nitride respectively, T is temperature during coiled layer fabrication, and $T_0$ is the approximate operating temperature of the device.

Assuming the thicknesses and Young's Modulus for silicon and nitride are equal, the calculation is simplified to:

$$R = \frac{2}{3} \cdot \frac{t_{total}}{(\alpha_{silicon} - \beta_{nitride}) \cdot \Delta T_{FABRICATION}}$$

Therefore, if, e.g., the total thickness of a memory sheet, $t_{total}$=1000A, and $(\alpha_{silicon} - \beta_{nitride})$~10 ppm/C and the change in temperature $\Delta(T_{fab} - T_{operating})$=200 degrees C.; then R=33 microns.

Figure 8A:
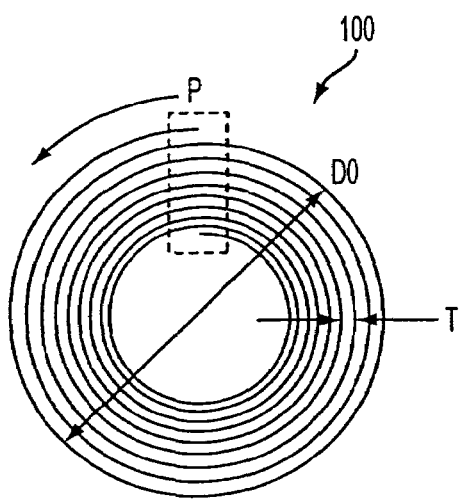
Figure 8B:
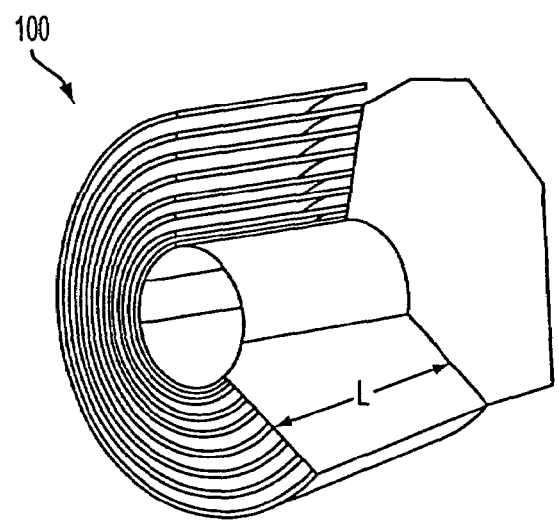

FIG. 8 illustrates a cross section of an illustrative coiled circuit device. The periphery of device 100 can be calculated from the formula $$P = \frac{\pi}{3}(D_0 2/T).$$

For a diameter of 100 microns and a T=1000 angstroms, the periphery P corresponding the length of the memory sheet to be coiled is 10 cm. If the width of the sheet is set to 10 mm or 1 cm, then a memory device having an area of 10 square cm (i.e., 10 cm×1 cm) can be fabricated into a coiled memory device having a cross-sectional area equivalent to a human hair, and a length of 1 cm. Such a device can have well over a GB of memory.

Figure 9:
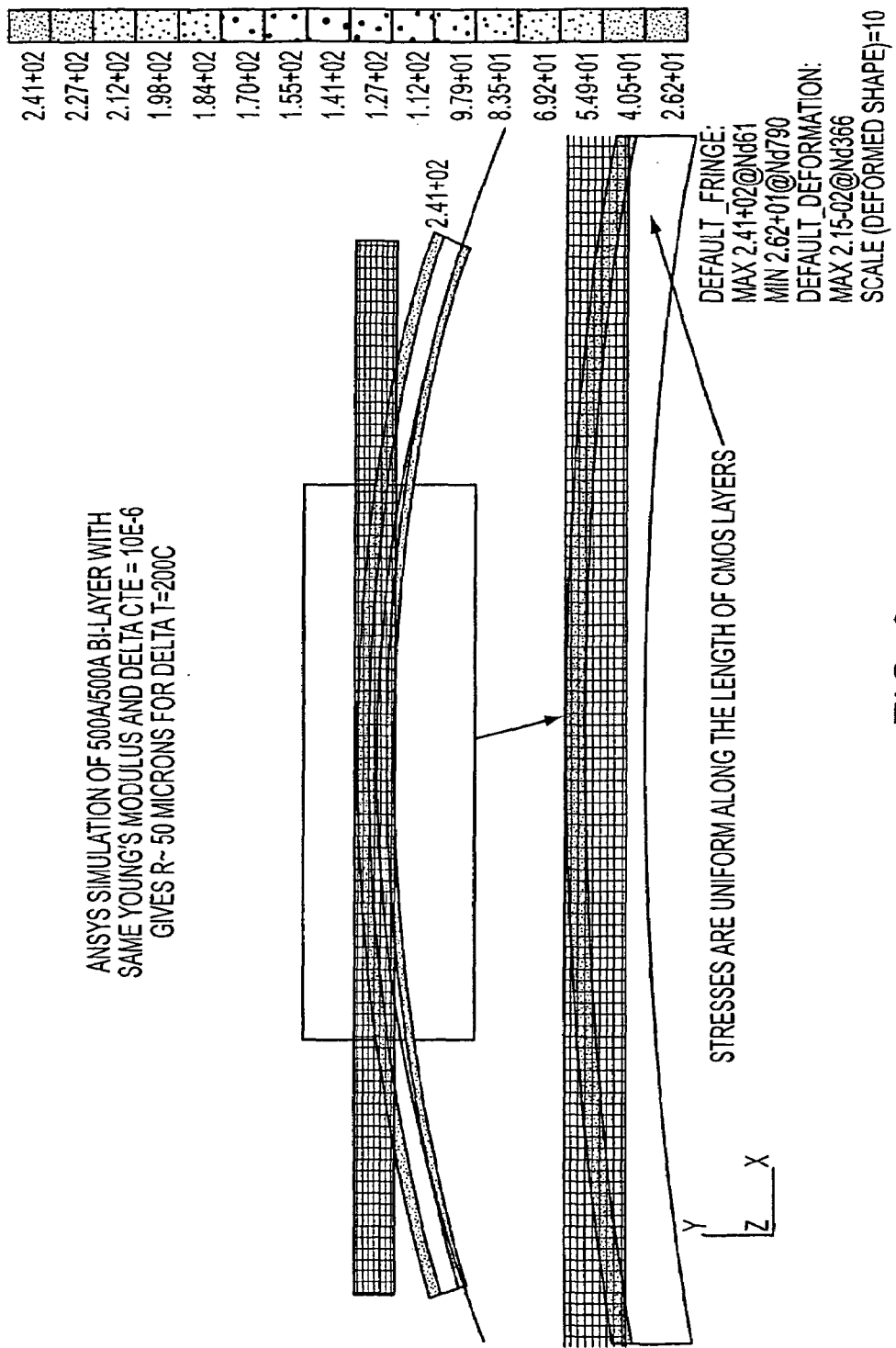
FIG. 9 is a graph of a simulation of stress levels of the coiled memory sheet according to an embodiment of the present invention.

In FIG. 9, computer simulations were performed to create graphical illustrates of stresses in a coiled device. Here, it is shown that the silicon memory device will be stable and have uniform stress along the length of the CMOS layers. The temperature dissipation during usage of the preferred embodiments should also be acceptable.

The temperature rise in a working coiled memory device, assuming radial heat conduction limited by an assumed worst case 20, angstrom air gap of $K_{EFF}$=0.0005 watt/cm-K between each of the windings, can be predicted by the following:

Trise=Power*$Z_{THERMAL}$; $Z_{THERMAL}$~0.05° C./WATT/
Layer or 25° C./WATT for a 500 Layer structure Power~0.5×$C_{LINE}$*$V_{WRITE}^2$*$F_{WRITE}$=0.6 milliwatts/
Mhz write, for $V_{WRITE}$=10 volts~0.06 watts for
100 lines writing at 1 Mhz or~0.12 watts for 100
lines writing at 2 Mhz. therefore, Trise@ 2 Mhz=~0.12 watts×25° C./WATT ~3° C. rise
from Outside Gold Surface.

Figure 10:
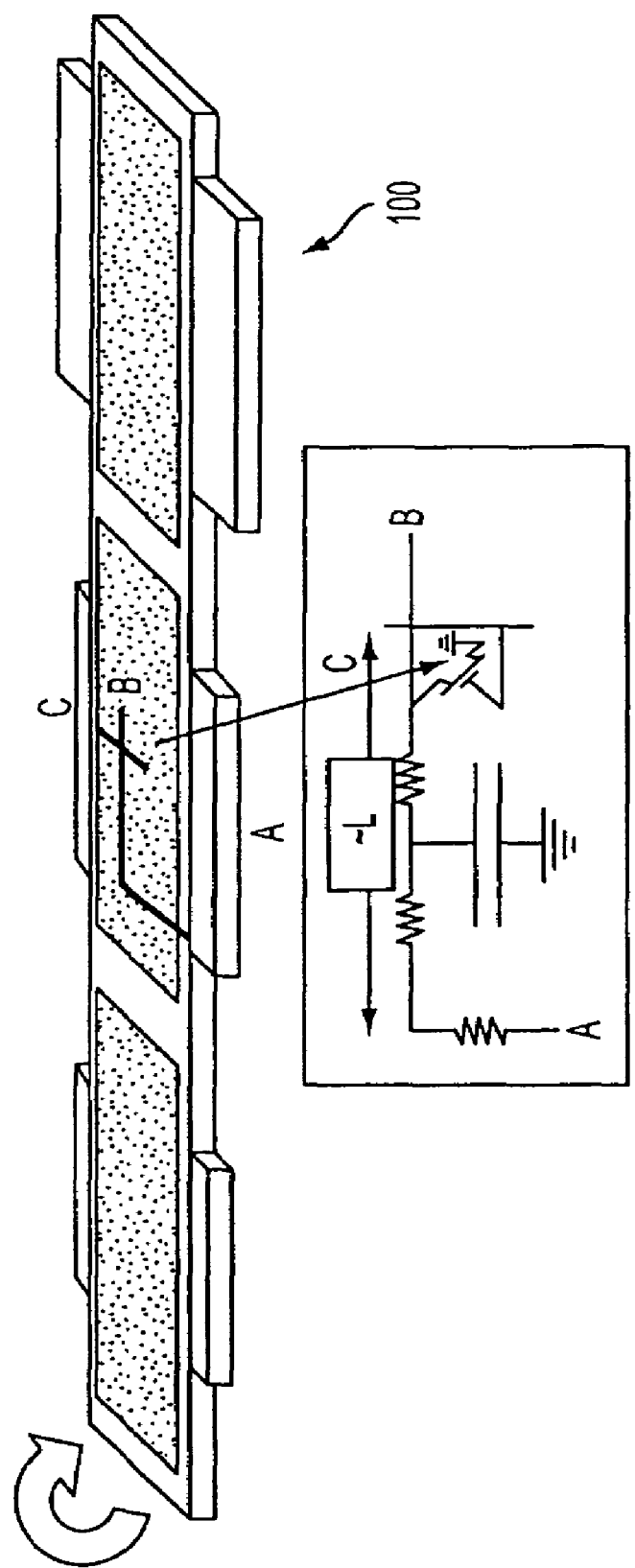
FIG. 10 is a view of a memory sheet with a word-line circuit diagram illustrating the address capacitance and address resistance of the circuit.

As should be understood based on this disclosure, the read/write speed of memory circuits can depend upon the thickness of the various components (i.e., lines, etc.) of the device. The read/write speed of the device is also affected by RC limitations due to thin address lines and gold insulators. Referring to FIG. 10, read/write speed can be calculated as follows:

$TAU_{READ}=R_{LINE}*C_{LINE}=2*\rho_{GOLD}*\epsilon_{OXIDE}*(L^2/$
$(W_{OXIDE}*t_{GOLD}))=2E-18*(L^2/(_{OXIDE}*t_{GOLD}))$
seconds;

Taking $t_{GOLD}$=250A; $W_{OXIDE}$~250A and $L_{LINE}$=
0.5 cm, $TAU_{READ}$=80 nanoseconds or $F_{READ/WRITE}$~2 Mhz,
where $C_{LINE}$=13.2pf. For $t_{GOLD}$=
75A, $Tau_{read}$=240 ns.

Note that $R_{LINE}=\rho_{GOLD}*L_{LINE}/A_{LINE}$=3E−6*0.5/ (250A*1E−4)=6000 ohms <<ZC OFF of the memory element at write frequency.

Therefore, with a thickness of gold set to, for example, 250 angstroms, 80 nanosecond read/write times can be achieved. At 75 angstroms, 240 ns read write times are predicted. Accordingly, one skilled in the art will understand to optimize size and speed or that speed may be sacrificed for a minimum size and vice versa. Of course, one will understand that the same principles can be applied to non-memory circuits as well.

Stress Ridges for Non-Telescoping Coil

Achieving significantly improved volume density (e.g., 1000×) of devices compared with the top planar technology available today, requires that these devices be coiled tightly with no helical or telescopic coiling. Preferably, each subsequent coil perfectly overlaps the previous one.

Figure 11:
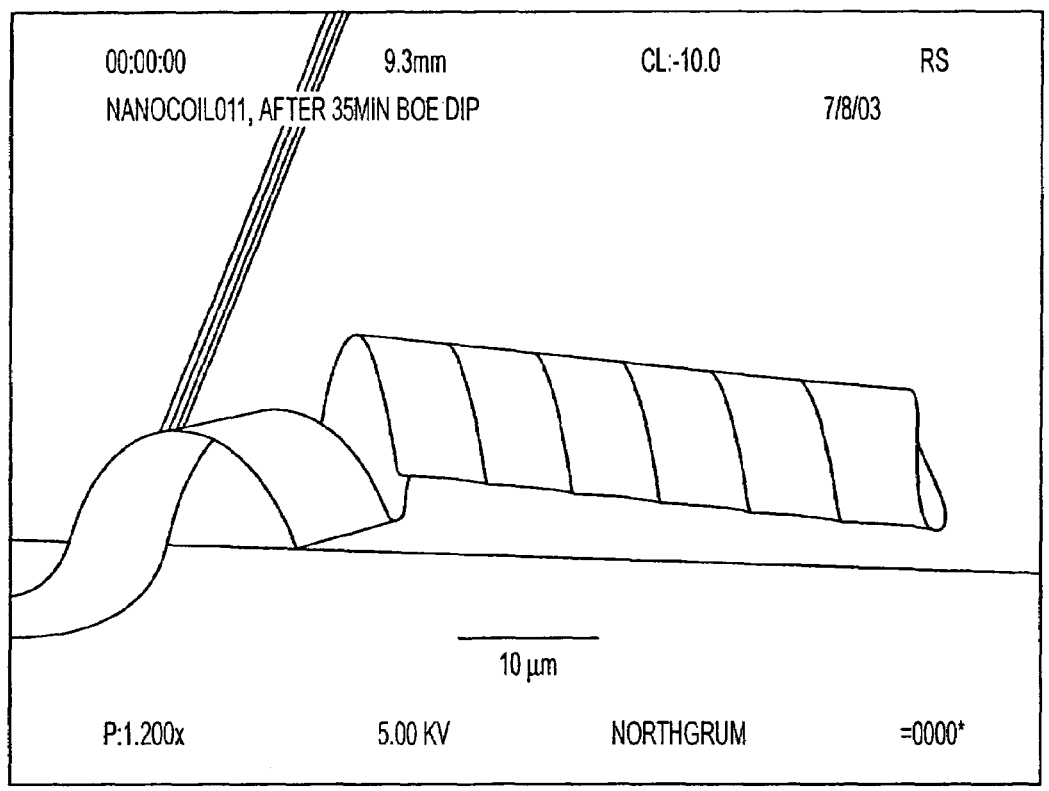
FIG. 11 is an image of a coiled memory device that is telescoping during coiling.

FIG. 11 is a SEM image from an experiment of a released coil with the silicon circuitry layer (shown with no devices) plus the stressed nitride layer. In this image the silicon circuitry layer was 500A thick and the nitride stress layer was 500A thick. The attempt of coiling displayed a very small coiling radius of 7 um, however the coil showed significant telescoping, thus substantially increasing the volume present per device storage area.

Figure 12:
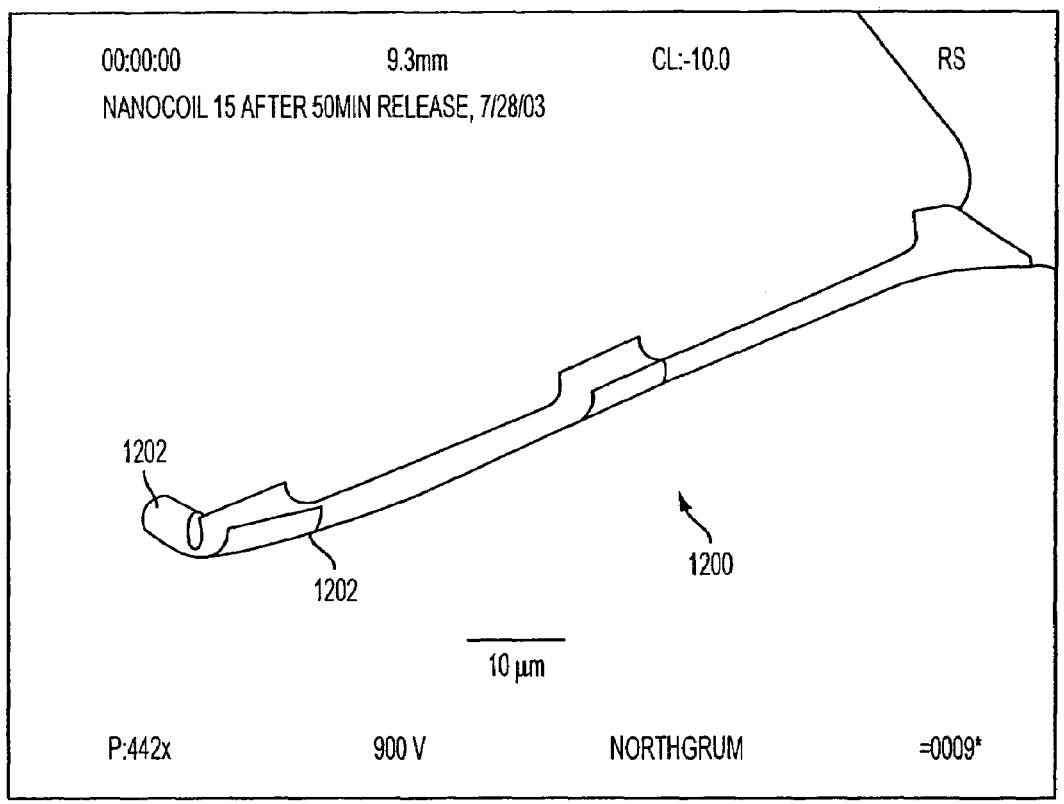
FIG. 12 is an image of a memory sheet in which traverse curling occurred.

It has been determined that the stress in the films is biaxial, and therefore, the coiling stress can cause the film to coil along multiple axes, as is shown in the SEM image of FIG. 12. This test structure began to coil in the primary direction (along the length of the strip 1200), however side tabs 1202 curled in a transverse direction to the primary direction. In order to achieve large area coiled memory devices transverse coiling must be eliminated.

Figure 13:
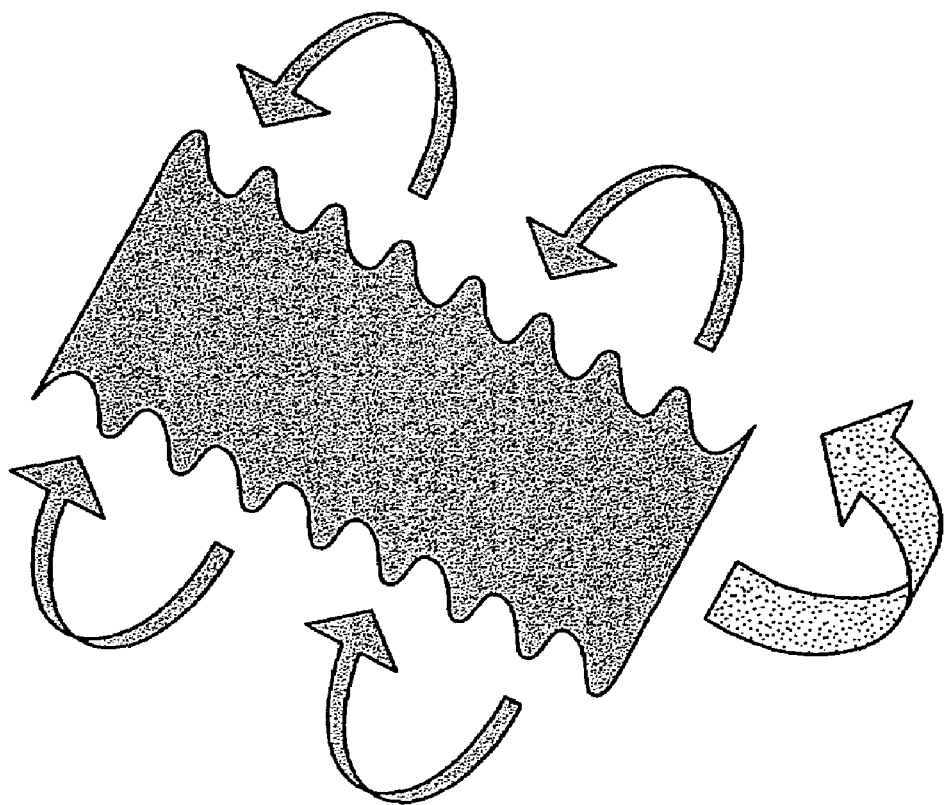
FIG. 13 illustrates ridges in a circuit that facilitate coiling.

As is explained in further detail below, stress ridges (shown in FIG. 13) can be incorporated into the coil in order to control the direction of coiling. These ridges, or corrugations, when fabricated into the silicon circuitry and/or stressed nitride layers, effectively stiffen the coil and prevent curling in the transverse direction. Thus, only stresses act in the primary direction, and the device will coil properly. The addition of the ridges to the silicon circuitry and/or stressed nitride layer facilitates a nearly perfectly overlapped coil with no telescoping.

Figure 14A:
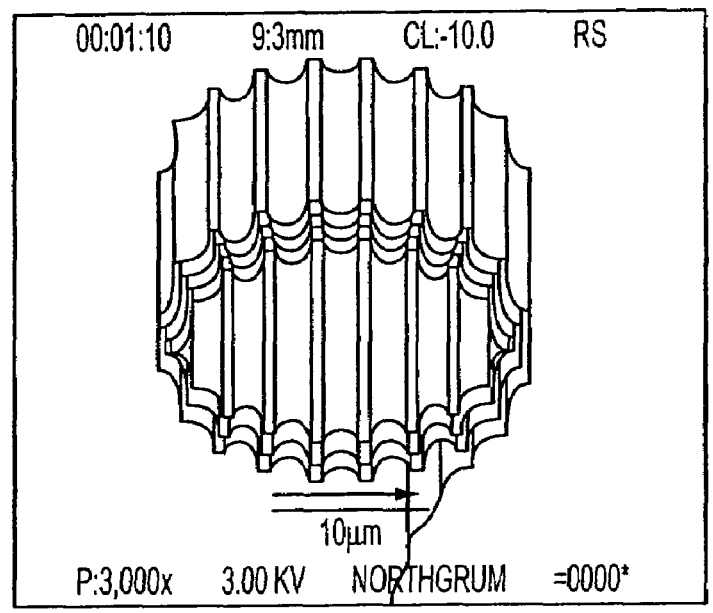
FIG. 14 shows a perspective and front view of a coiled circuit device having ridges according to an embodiment of the present invention.
Figure 14B:
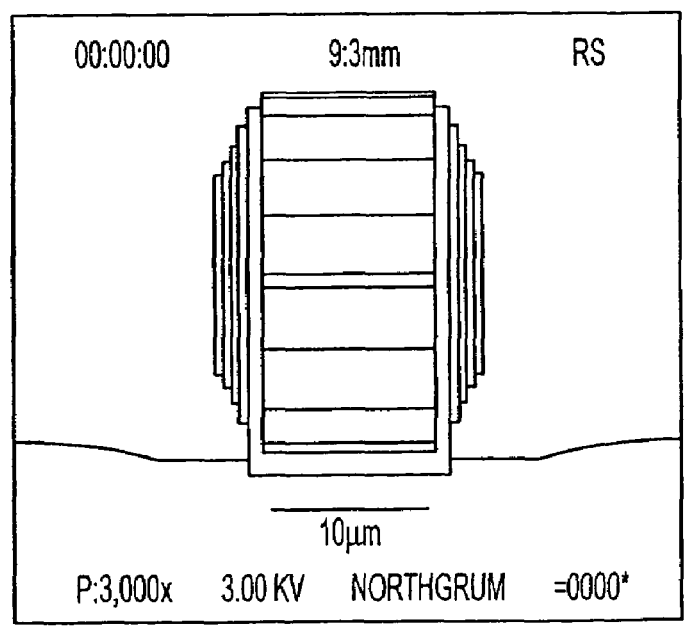

FIG. 14 shows a perspective view (left) and front view SEM images of a 7-layered coil with ridges. The corrugated coil shown in FIG. 14 has in inner radius of 7 um and an outer radius of 10 um, an uncurled length of 300 um, and a linearly varying width from 14 um at the unattached tip of the coiling arm down to 10 um at the attached end of the arm. As a result, the corrugations prevent telescoping from occurring during coiling.

Figure 15A:
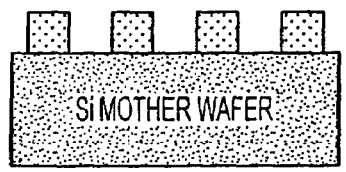
FIGS. 15a-e illustrate steps for fabricating a circuit sheet having ridges according to an embodiment of the present invention.
Figure 15B:
Figure 15C:
Figure 15D:
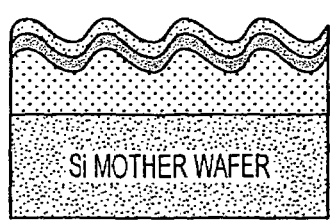

An exemplary process for forming the ridges in the device can be described with reference to FIGS. 15A-D. In this embodiment, a pre-ridged preferably silicon oxide sacrificial layer is first fabricated onto the wafer. As shown in FIG. 15A or 15B, ridges may be deposited having sharp or smooth corners, but are preferably smooth. Ridges made with smooth corners relieve weak points at the films corners, which might make them brittle at the sharp corners. A highly doped borophosilicate-glass (BPSG) can be deposited and slots are etched down to the silicon wafer substrate. The BPSG can be deposited at 900° C. for 30 minutes to eliminate the sharp corners, after which a second coat of oxide is deposited (FIG. 15C) over the smoothed bumps to achieve a continuous sacrificial layer with ridges. The circuitry and stress layers are then deposited onto ridged sacrificial layer (FIG. 15D) as already described herein. The device 100 is released by dissolution of the oxide release layer, such as with hydrofluoric acid.

The above method forms ridges in the coiling layers when the circuitry layer is composed of poly-silicon and can be deposited on the preferably silicon oxide release layer. Although a poly-silicon circuitry layer can be used for specific types of devices (e.g., Thin Film Transistors, TFTS), the majority of memory devices require a single crystalline silicon circuitry layer. A single crystalline silicon layer cannot be deposited like a poly-silicon layer and therefore requires a different ridging and release process sequence.

Figure 15E:
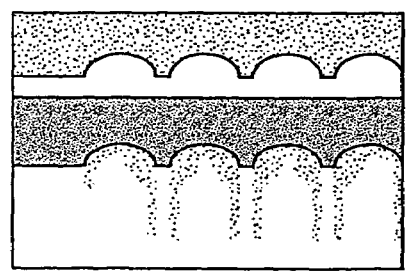

The ridges shown in FIG. 15E are 1 µm peak to trough, with 3 µm spacing between ridges. Although these severely corrugated ridges are effective in eliminating the telescopic curling stresses, it is not necessary to use such severe ridging. The ridge height can be easily tailored to utilize the minimum height necessary to block telescoping. Designs based on using smaller ridge heights are also contemplated. In fact, ridges smaller than the ones shown in FIG. 15E are preferable since ridges reduce the effective layer thickness and cause the memory device to have a larger volume density.

The ridges may be formed having progressively smaller size from one end of the device to the other so that the ridges line up when coiled.

Furthermore, it is possible to utilize a few initial ridges at an unattached end of the coiling structure and a flat film for the majority of the device area. That is, one end of the sheet 100 may be anchored, and/or only enough ridges to cause the proper curling are used instead of ridges throughout the entire sheet. The initial ridges enable the film to start coiling along the primary direction and the primary coiling will continue even after the ridges are no longer present.

Blocking transverse stresses by ridge stiffening is not the only way to achieve single directional coiling. Other techniques are contemplated such as by deactivating transverse stress.

Figure 16A:
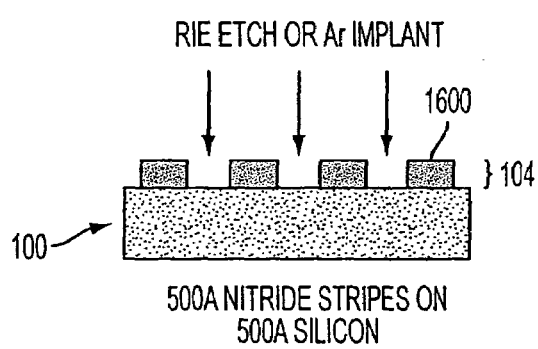
FIG. 16 shows a circuit device having coiling strips that facilitate coiling in the proper direction according to an embodiment of the present invention.
Figure 16B:
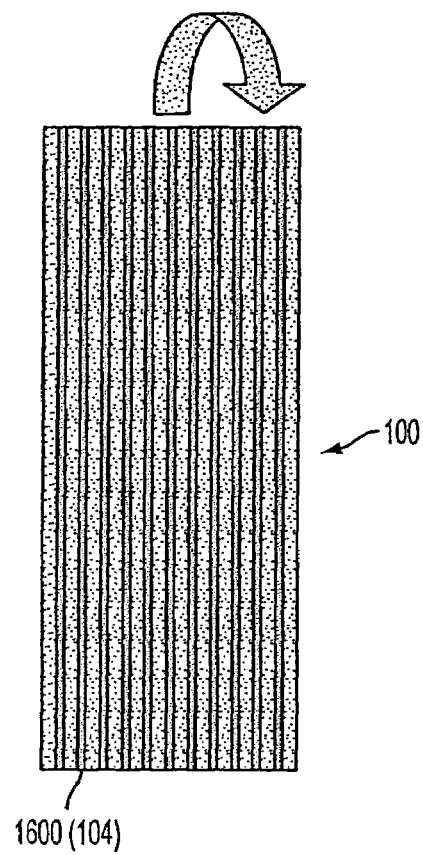

Referring to FIG. 16, transverse stresses are prevented by adding strips to the sheet 100. Through Reactive Ion Etching (RIE), or Ion implantation preferably with argon, the stress (coiling) layer (104) can be sliced into long thin strips 1600 along the primary coiling direction. Although this may slightly weaken curling in the primary direction, it completely eliminates all transverse stress, allowing the sheet 100 to curl solely in the primary coiling direction.

One potential advantage of this embodiment is that it allows the circuitry layer to be flat instead of ridged. A flat circuitry layer facilitates simpler device processing techniques to be implemented during manufacturing of the devices.

Intrinsic Stress Coiling Mode for High Density Coiled Memory

In order to achieve sub 100 µm coiling diameter required for super-dense memory, the device layer film and stress layer film should interact to produce a net curling effect. As mentioned above, CTE differences between the layers of the sheet 100 achieve a bi-metallic curling effect and generate a curling force. Cooling creates a compressive stress in lower CTE film relative to higher CTE film.

Another technique to facilitate coiling of the device is through utilization of the intrinsic film stress developed during film growth. Intrinsic stress can be tensile or compressive depending on the specific growth process and has been shown in some instances to dominate stresses due to CTE differences. In addition, since intrinsic stress forms during the film growth, the growth conditions are critical to controlling the level and sign/direction of the stress.

One will understand that depending on where the coiling layer is in relation to the circuit (i.e., above or below), either tensile stress or compressive stress will be desired to cause the circuit layer to coil in the correct dirction.

Figure 17B:
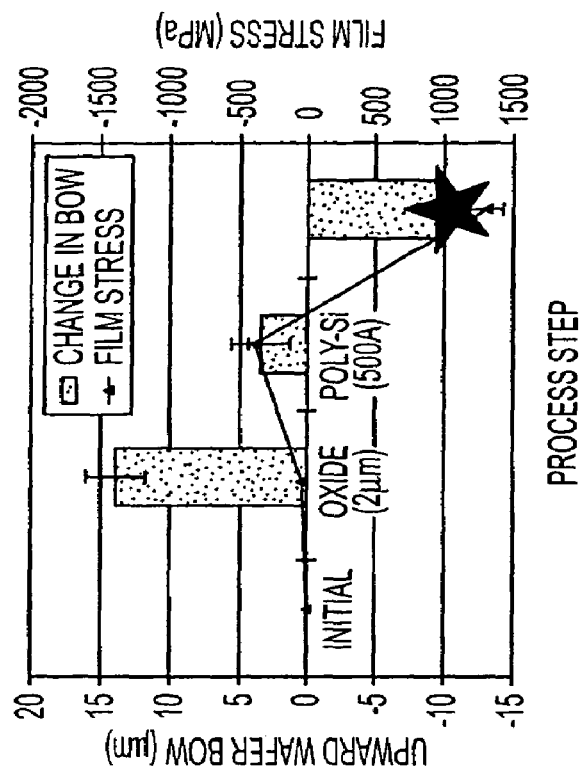
FIG. 17 includes graphs of wafer bow measurements.
Figure 17A:
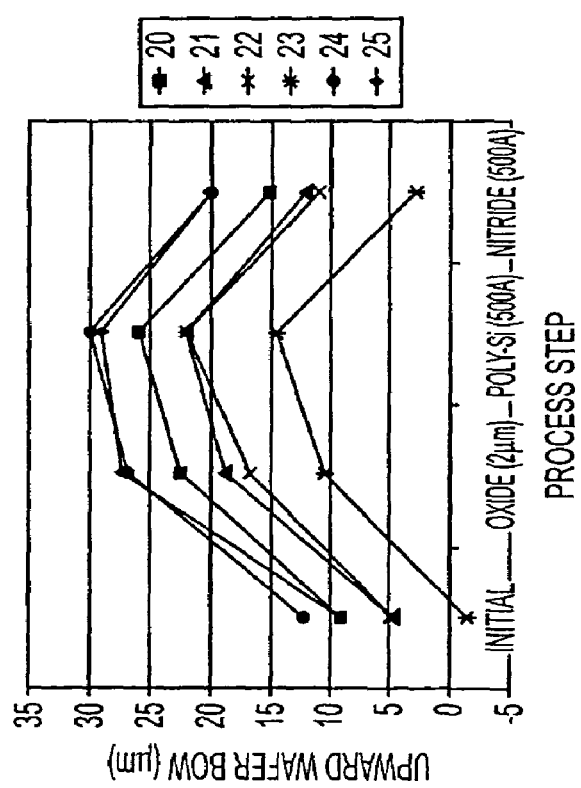
Figure 18:
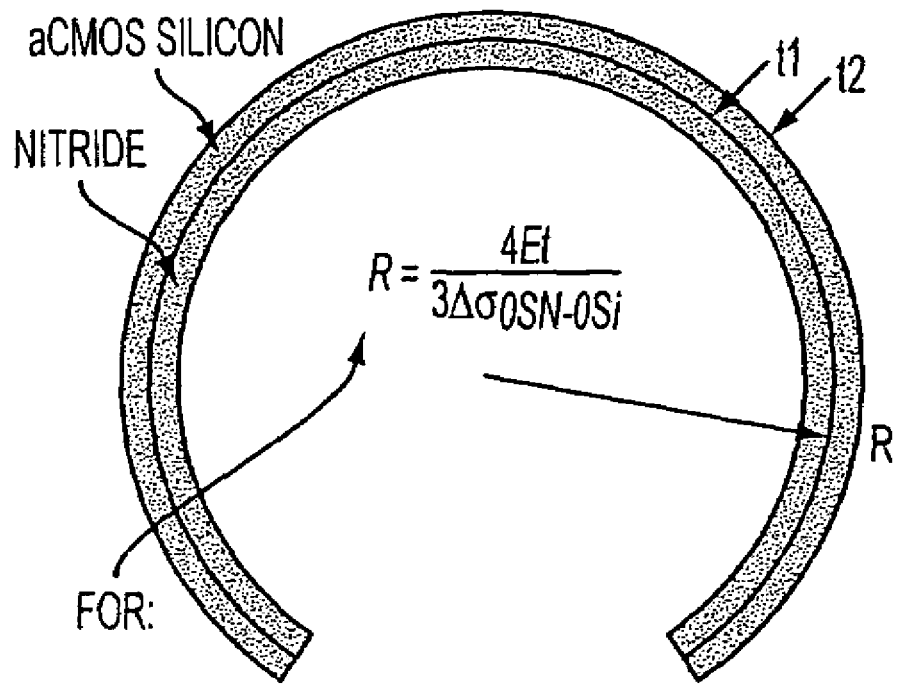
FIG. 18 shows stress-curvature models and the net differential intrinsic stress.

Referring to FIG. 17, wafer bow measurements of 6 inch Si wafers were taken before and after deposition of a 500A Low Pressure Chemical Vapor Deposition (LPCVD) silicon nitride layer. These measurements reveal a large, 1.4 GPa tensile intrinsic stress in the nitride layer. Similar experiments on poly-silicon indicate a smaller, 0.3 GPa compressive intrinsic stress with respect to the Si Substrate. Using stress-curvature models (see FIG. 18), the net differential intrinsic stress, ~1.7 GPa, between the nitride and poly-silicon films should produce a coil with a very tight radius of approximately 7 μm, and a coiling direction such that the nitride film is on the inner side of the bi-layer coil. Therefore, bi-layered nitride/poly-silicon films should curl more tightly and in the opposite direction than is predicted by the CTE based model alone. Experiments of released 500A nitride/500A poly-silicon bi-layer films show a close agreement with the intrinsic stress model, and have resulted in circuit coils having a radius of 7.5 um and the correct coiling direction.

Since intrinsic stress is a major, often dominant factor in the net film stress, it is important to consider its utilization in fabricating nano-coiled films.

Furthermore, since the intrinsic stress can be strongly linked to the deposition parameters of the growing film, it is possible to control the resultant stress in the films to engineer coils with other desirable properties. In light of these results, it has been determined that the intrinsic stress may be manipulated by control of (CVD) process parameters to induce the film stresses required for desired coiling of the nano-coil memory devices.

Contact Schemes

Figure 19B:
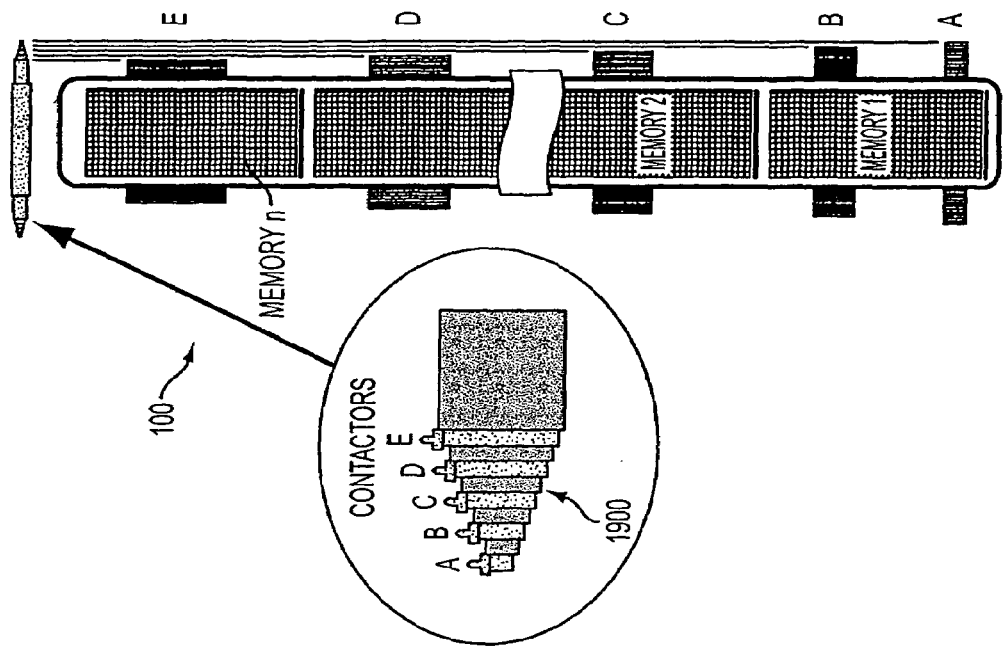
FIG. 19 is a front view image of the nanocoil.
Figure 19A:
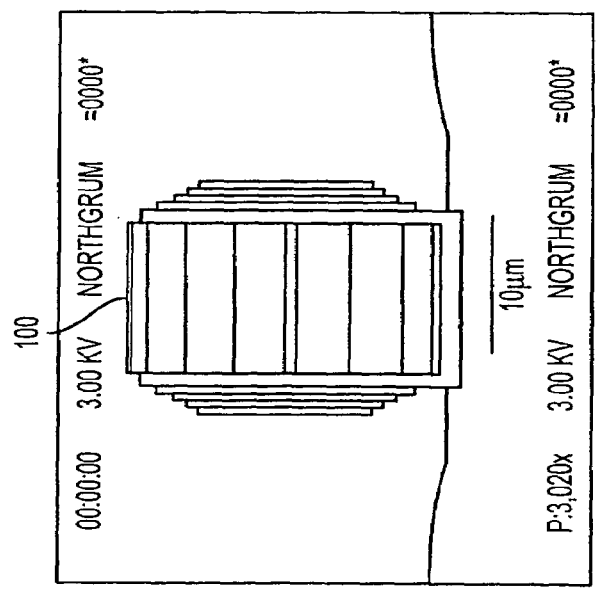

Referring to FIG. 19, a "pyramid" contact scheme is shown. This scheme is substantially the same as that shown in FIG. 3. The left side of FIG. 19 shows an image of an actual coiled circuit device 100 while the right side illustrates a memory sheet 100 before coiling, and the exploded view illustrates the pyramid contact scheme 1900 after coiling.

Width variation of the patterned coiling arm causes the pyramid end contact scheme to be created. The inner most winding protrudes further to the side than each subsequent winding such that each winding can be addressed from the end of the coiling structure, as shown in the blow up. As shown on the right, this can be accomplished by providing separate contact extensions 100A-E for each winding (or discreet circuit), or the width of the circuit itself could be varied. The amount of overlap of subsequent layers is easily controllable by changing the width variation of the coiling structure and is preferably tailored to achieve the optimum contact area per layer. Further, contact extensions 100A-E may be formed to comply with any standard, such as 46 pin PCI/CIA.

Figure 20:
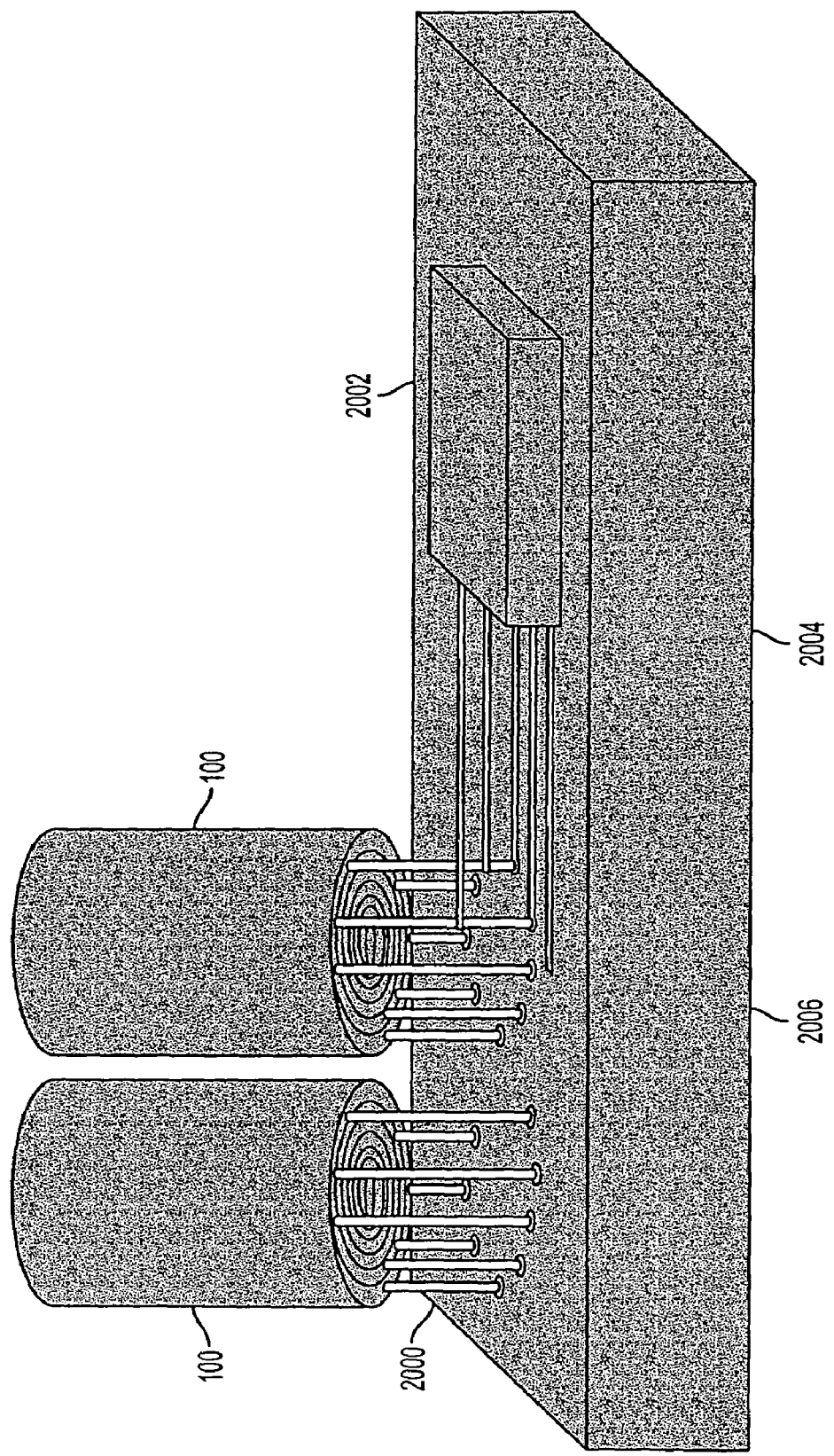
FIG. 20 illustrates an exemplary contact scheme which employs the use of side extension contacts.

Another contact scheme employs "side extension" contacts. Referring to FIG. 20, conventional contacts 2000 are formed for each circuit, which extend from the coil 100 to facilitate interconnection with other components. For example, as shown the side extension contacts 2000 can be along the edge of the device 100, so that after the device 100 is coiled, the contacts 2000 are spaced to allow the memory coils to be vertically coupled with a device 2002 such as an Input/Output control circuit for high density packing of multiple coils through Vias 2006 and sunken leads 2004.

Figure 21B:
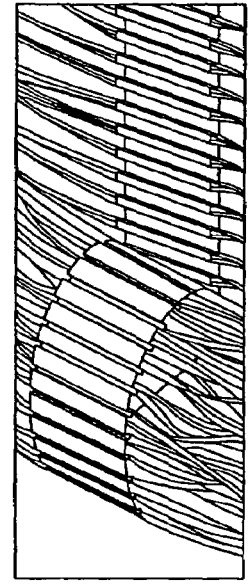
FIGS. 21a-b illustrate fabrication of side extensions.
Figure 21A:
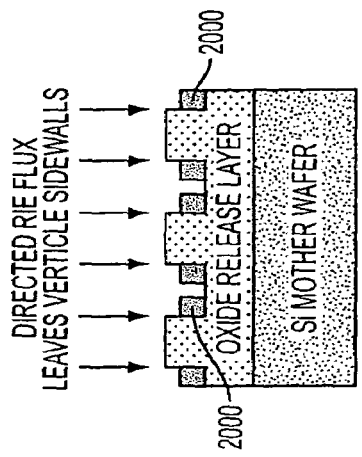

Side extension contacts 2000 can be formed by an anisotropic RIE process. As shown in FIG. 21a-b, for the embodiment of the invention having ridges, the nitride/polysilicon layer deposited onto the sacrificial layer can extend beyond the device. As shown in FIG. 21b, the anisotropic RIE process does not remove a portion 2104 of the nitride/polysilicon layer. This portion 2104 remains and forms a wire-like side contacts 2000, which can be metalized to decrease resistivity. The side contacts 2000 can be connected to the circuits of the device by known means.

Figure 21D:
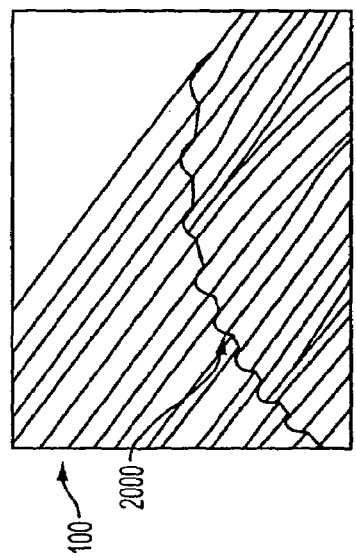
FIGS. 21c-d are images of exemplary side extension contacts.
Figure 21C:
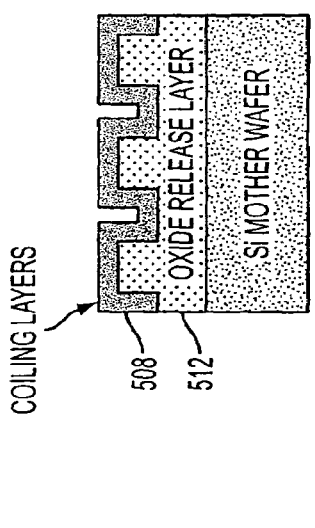

Referring to FIGS. 21c-d, two SEM images show the side extension contacts 2000 created by an anisotropic RIE process on coiling films with sharp vertical edges. In these examples, the side contacts 2000 are fabricated nitride and silicon layers, however, as described above, the contacts could be metalized for lower resistivity. Furthermore, the side extension contacts do not interfere with the coiling process and therefore should allow the reproducible coiling necessary to plug the coiled device into a defined via pattern on the control wafer.

A pad contact type is shown in FIG. 29. Here, a contact pad region 2900 may be formed at one or both ends of the memory circuit 100. The contact region 2900 may be formed onto the same wafer as the device 100 without any sacrificial layer underneath it. As a result, the contact pad can act as an anchoring region for the device 100 during coiling.

The anchoring area 2900 preferably comprises a rigid dielectric material (e.g., sapphire crystal). The anchoring area 2900 is preferably fabricated onto the substrate with no sacrificial layer underneath it, thereby facilitating coiling in the correct direction (see FIG. 29B). Input output (I/O) connections 2902 are placed onto the anchoring area 2900, which may connect to leads from the circuits of the coiled device. One advantage to this scheme is that each nanotube device 100 may be individually used or may be grouped with other nanocoils into a larger device.

Referring to FIG. 30a, a number of devices 100 may be fabricated onto a single wafer 3000. Each device 100 may include anchor I/O regions 2900 and may be paired, such that I/O regions 2900 are adjacent, or may even be shared. When the sacrificial layer is removed and the devices 100 are coiled, a number of adjacent devices 100 are formed in pairs 3004, such that the I/O pads 2900 of each pair of devices 3004 are contiguous. A series of device pairs 3004 are formed in parallel to form a section 3002. Section 3002 may be scribed from the wafer to form a single memory stick 3010 (FIG. 30b). Other devices may be formed onto the memory stick 3010, such as a driver 3012 (shown here as a nanocoil), or I/O and processing circuit may be entirely included in each nanocoil 100. Stick 3010 may have a separation pad region 3006 for I/O.

As shown in FIG. 30a, the nanocoils 100 can be arranged such that sets of two contiguous coils, having their respective anchoring area adjacent. Then, during the coiling step, the sets of two nanocoils coil towards each other since the anchoring areas are not undercut. Each set can be scribed from the substrate. Solder pads or bumps (shown in FIG. 31) 3104 can be added to the I/O connectors to facilitate integration with other components.

Figure 31:
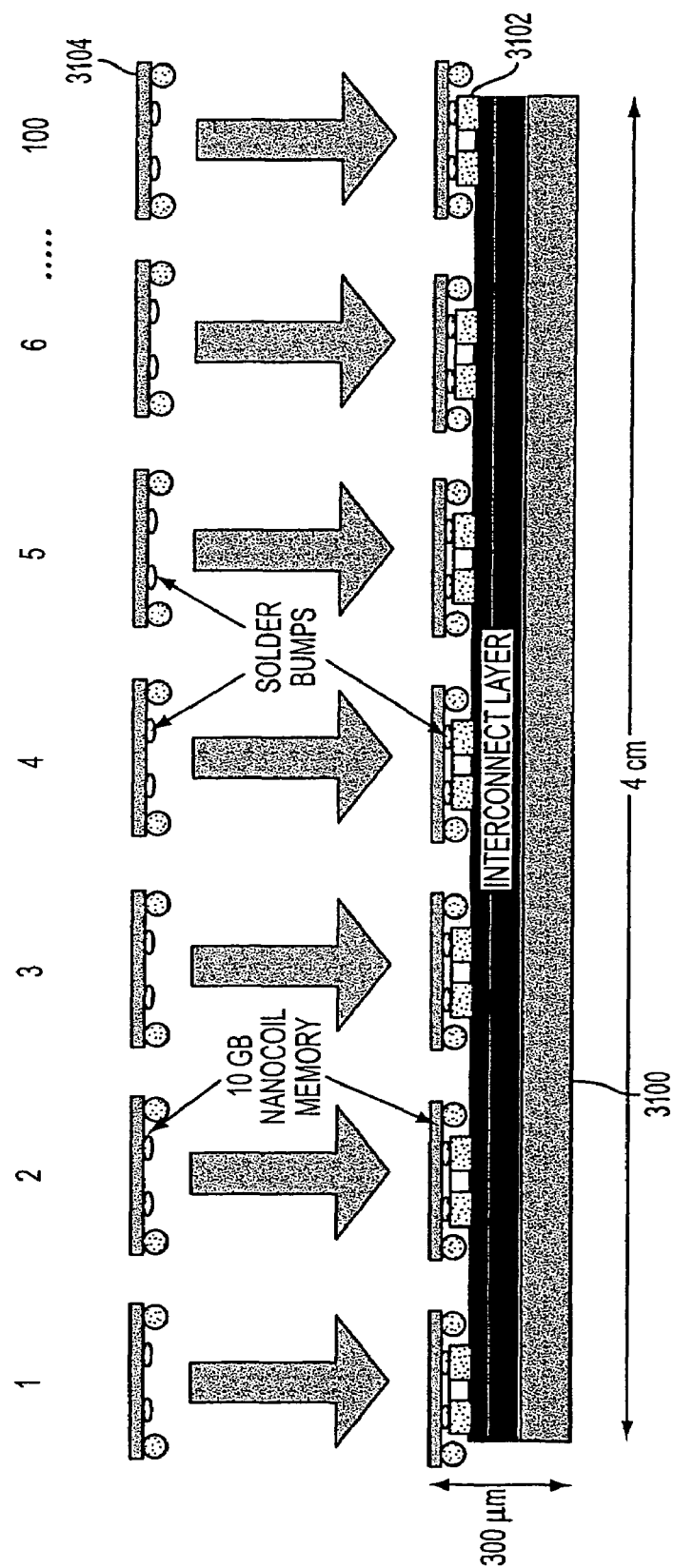
FIG. 31 illustrates a plurality of device sticks being connected with an interconnect layer.
Figure 32:
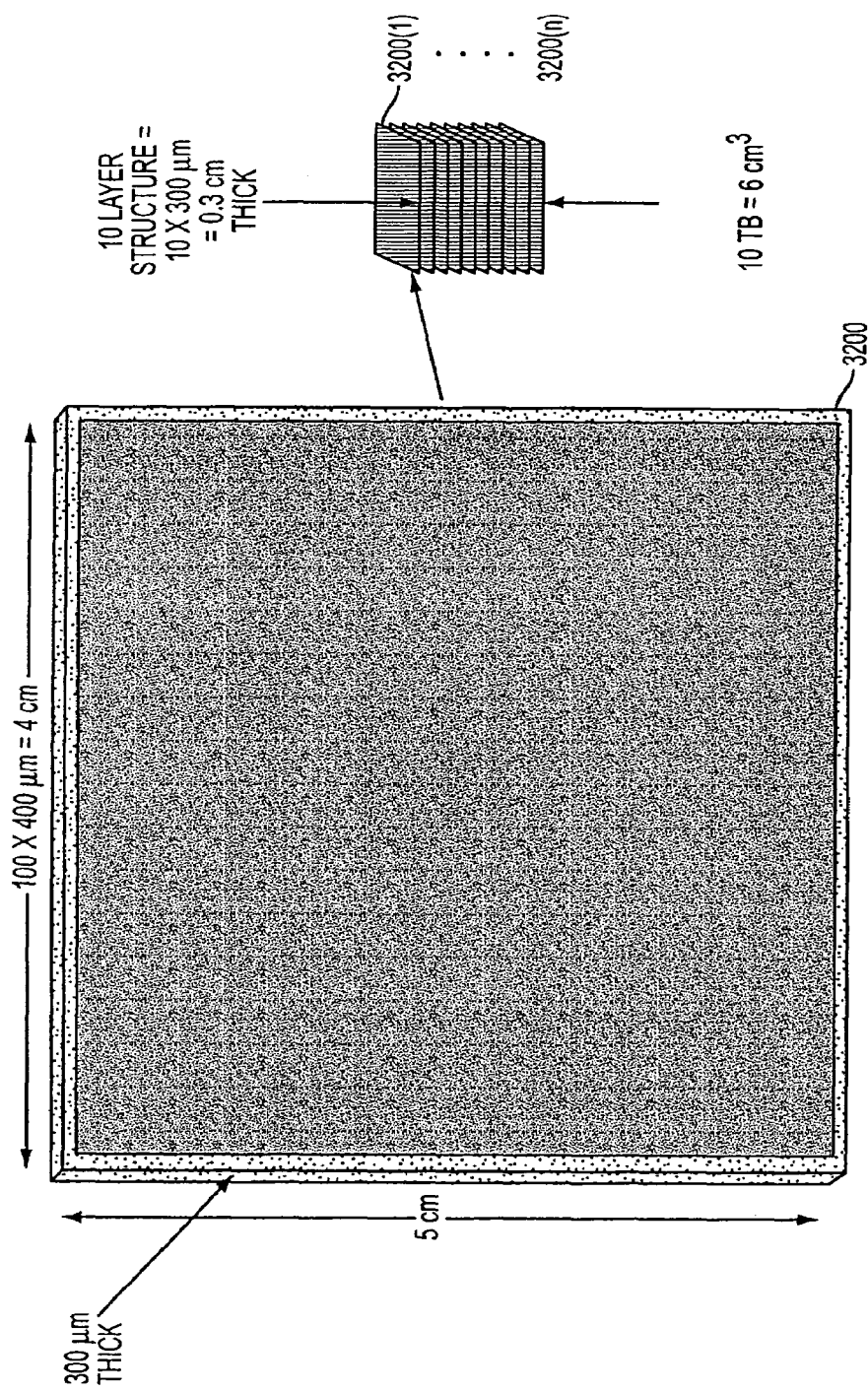
FIG. 32 illustrates a memory card according to an embodiment of the present invention.

Referring to FIG. 31, a plurality of nanocoil sticks 3010 are connected to a single interconnect layer 3100. The interconnect layer 3100 may have raised pads 3102 which contact the solar pads 3104 of the anchoring layer for each nanocoil. As such, any number of nanocoil circuits may be combined to form a single device. One skilled in the art will readily understand that various connection scheme to achieve any desired device geometry. For example, referring to FIG. 32, a plurality of memory sticks are shown connected into a single layer 3200. If each memory stick 3010 is 5 cm long and 400 μm wide, then 100 memory sticks 3010 may be connected onto a single board that is merely 20 square centimeters. If the board 3200 is only 300 μm thick, then 10 boards 3200 could be stacked to form a 10 TB memory card. Similarly, any number of structures could be connected and stacked to form a conventional shape, such as an SRAM card.

Figure 33:
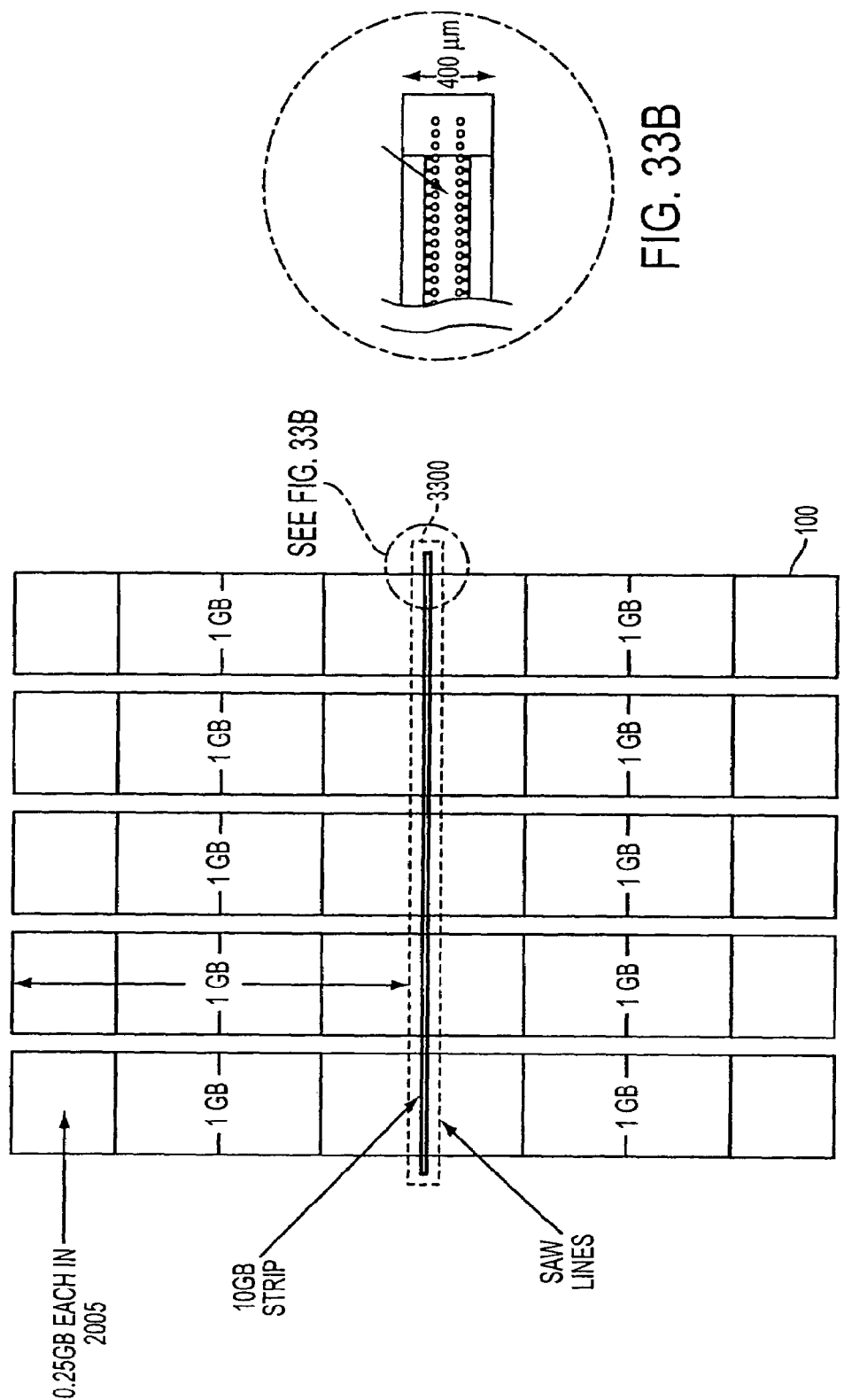
FIG. 33 illustrates a plurality of devices being fabricated to share a single bus bar according to an embodiment of the present invention.

In FIG. 33, additional details of the contact scheme used in the memory strip of FIG. 30A-B are shown. Here, a single bus bar 3300 is used for a group of 10 nanocoils 100. Contact lines (not shown) can be connected to the bus bar 3300 and soldered to vias therein. The bus bar 3300 can be formed on the wafer substrate during metalization of the circuit layers. After each of the nanocoils is coiled, the bus bar 3300 is scribed from the wafer to form a single stick 3010. Thus, a single stick can be formed with 10 nanocoil devices having a single bus bar connection 3300.

Figure 34:
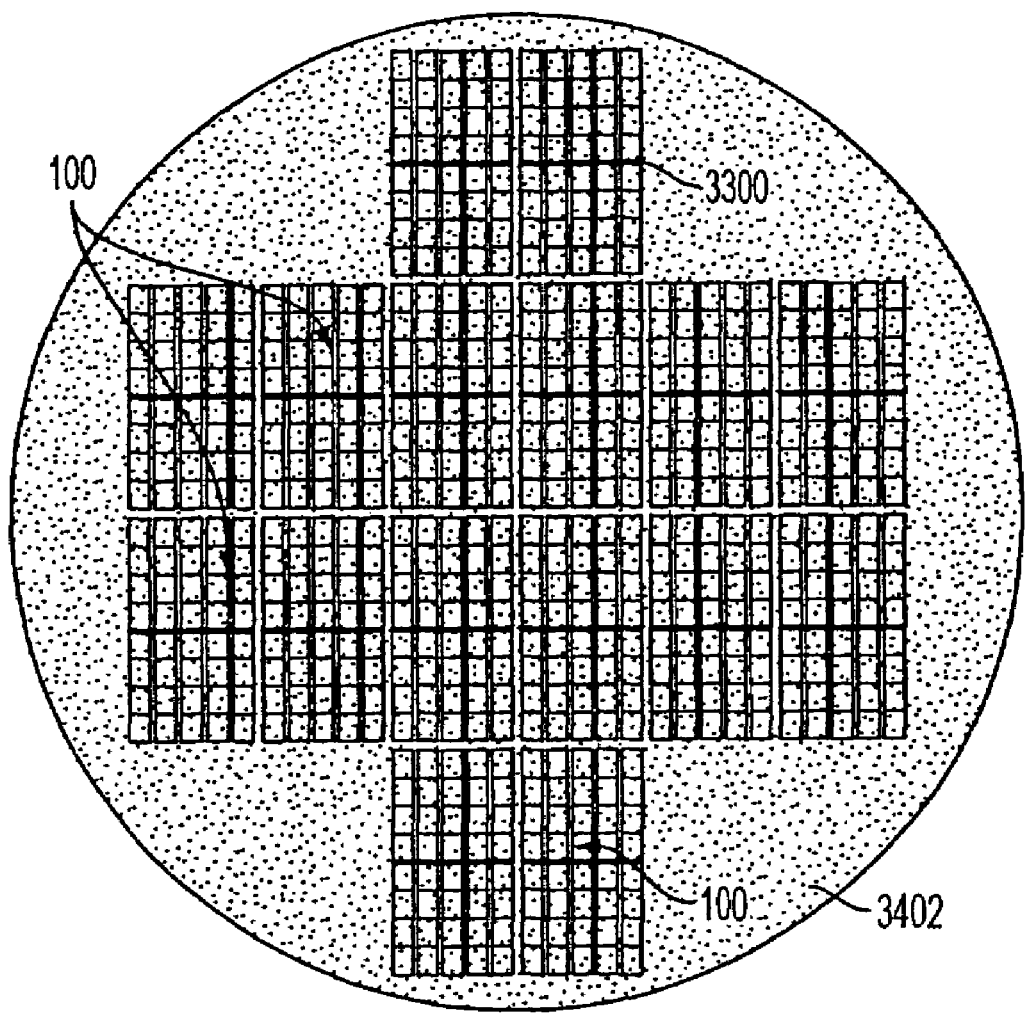
FIG. 34 illustrates a plurality of groups of devices as shown in FIG. 33 fabricated on a single wafer.

In FIG. 34, a number of the nanocoil groups shown in FIG. 33 are shown on a single wafer. If each bus bar 3300 is anchored to the wafer 3402, then a plurality of the device sticks can be fabricated from a single wafer 3402. These resulting sticks can then be used in the assembly scheme shown in FIG. 31, where each memory stick is inverted and ball bonded to the raised portions 3102 in the figure.

FIG. 35*a* shows a coiled device having vertical layer-to-layer contacts. As shown in FIG. 35*b*, plate through contacts 3502 can be formed onto the device sheet connected with the pad type or bus bar external contacts (A). Contacts 3502 are disposed on increasing distance centers to compensate for increasing coil diameter. As shown, the distance between sets of contacts 3502 begins with the inner circumference but is then increases an amount S (1-N) for each revolution. As a result, during coiling, the contacts 3502 line up to form vertical address lines 3504 through the layers. In this example, the vertical lines are a radial distance theta, which represents the desired vertical contact trunk. T is the thickness of the device layer.

These vertical lines decrease the line distance within the circuit tremendously, covering the distance of a single revolution with only the thickness of a single layer. Also, only three bumps are shown per layer in FIG. 35*b*. However, the geometries are so small that a very large number of contacts could be formed. For example, a 46 pin PCI/CIA compatible structure could be formed.

To create the plate through contacts 3502, milling and etching techniques may be used. A barrier between the contacts 3502 and an insulator layer may be necessary in order to prevent cross talk or a short. If, upon coiling, the contacts 3504 do not line up perfectly, a quick thermal annealing step could be performed to force the contacts to coalesce.

Obviously, by making a path length to the inner coil portions of a coiled circuit device that is as short or shorter than paths to the outer coil portions, read/write speeds will be increased tremendously. However, these through contacts can increase processing in other types of circuits because parts of a processing circuit can be disposed closer together for increased system speed (e.g., locating a memory cache closer to an arithmetic or other data processing unit). This contact scheme may also be used as a heat sink to remove heat from the inner coils as well.

Release Techniques

Figure 22:
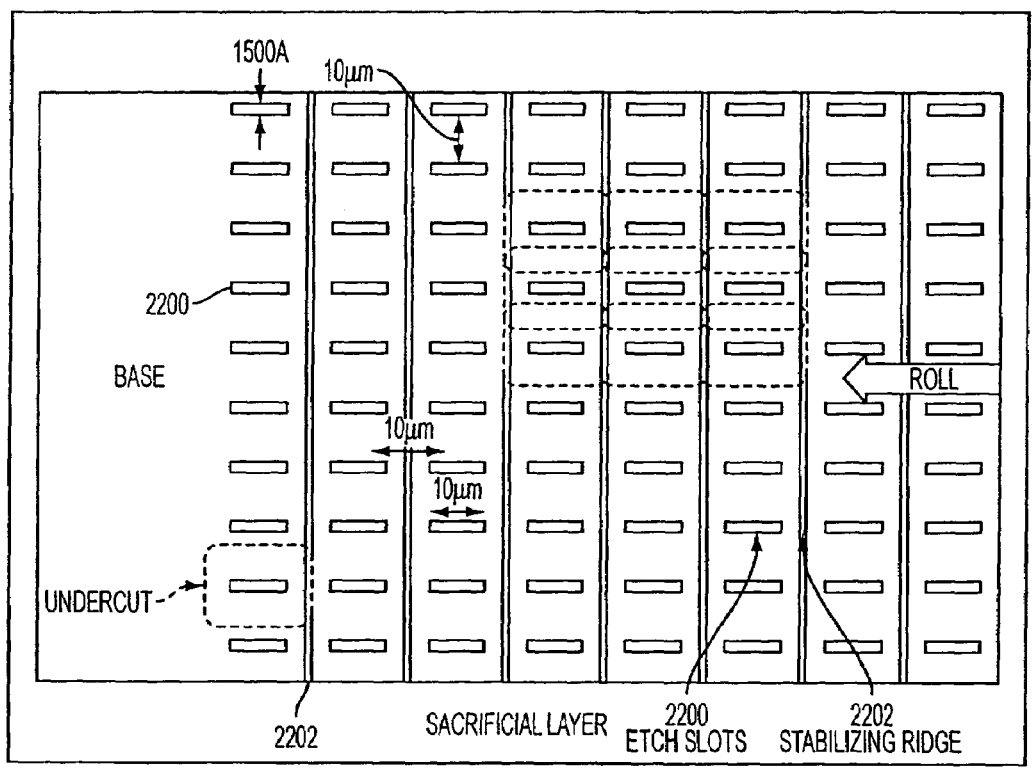
FIG. 22 illustrates a technique in which slots may be etched into the coiling layers to improve the curling process.

Additional techniques for releasing and coiling the device of the present invention are contemplated In addition to the release techniques described above. For example, to release large sections of the coil, slots may be etched into the coiling layers. Slots will expose more of the sacrificial layer, and therefore allow a more efficient removal of the sacrificial layer. Referring to FIG. 22, slots 2200 are etched in the coiling direction. As shown, 7500A×10 μm slots 2200 are etched into the coil and are evenly spaced and spread across the whole area of the surface of the device. Ridges 2202 may be added between each set of slots in the coiling direction to further facilitate coiling.

The slots 2200 improve the removing of the sacrificial layer such that a device having a larger width may be released, but the device area is reduced as compared to a continuous film of the same width since devices cannot be processed over the slots. This technique may also facilitate a faster rate of coiling than possible with a continuous film that requires side etching alone.

The wafer-bonding flip processing technique described above with reference to FIGS. 5A-G, is applicable for coiling due to thermal expansion stress induced coiling. However, with coiling due to intrinsic stress a different processing technique is preferably implemented.

If the coiling layer, which preferably comprises nitride, is in tension relative to the silicon device layer, the released film coils in a direction opposite to that predicted by the CTE model. Intrinsic coiling away from the substrate eliminates the need for the wafer-bonding flip process and simplifies the overall release of the coil.

Referring to FIGS. 23*a-d*, first, a ridges are formed on the sacrificial layer or on an oxide layer onto of the sacrificial layer (23*a*). Next, the device layer (e.g., memory, integrated circuit, etc.) is formed over the a Silicon on Insulator (SOI) device includes a silicon wafer 1300 having a single crystalline circuitry layer 1304 on a buried oxide 1302 thereon. Ridges 1304 may be etched directly into the silicon circuitry layer at the end or along the length of the coiling structure so that coiling primary direction coiling is induced. After forming the ridge structures, release slots may be etched into the coiling layers exposing the sacrificial layer underneath.

Figure 23A:
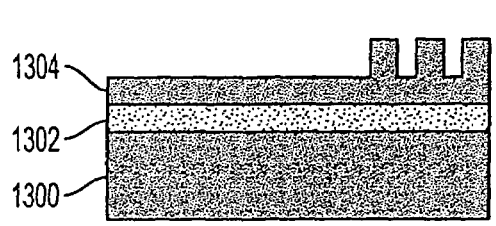
FIGS. 23a-e illustrates a process for fabricating the nanocoil device utilizing ridges at the beginning of the coil according to an embodiment of the present invention.
Figure 23B:
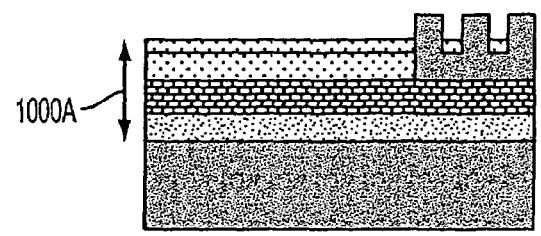
Figure 23C:
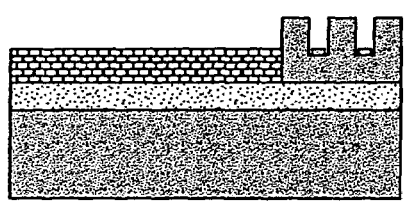
Figure 23D:
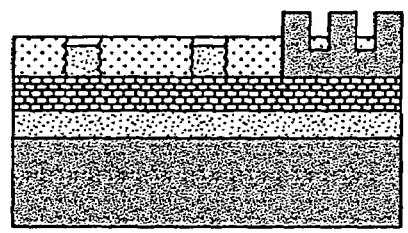
Figure 23E:
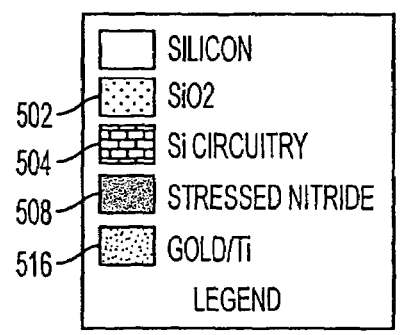

Next, the devices are fabricated into the 500A thick circuitry layer by standard device processing techniques (FIG. 23*b*). After processing, a preferably tensile stressed 500A nitride layer is deposited on top of the devices as a dual-purpose stress (coiling) and insulation layer. Then, preferably a thin 75A Au shielding layer is deposited onto the stress layer. Next, an RIE etch is performed to define the coiling sections and side extension contacts such as already described above. The coiling layer is preferably released by dissolving the buried oxide layer in HF(FIG. 24).

As explained above, the sacrificial layer is not necessary if a dry release process is used. "Selective Smart Cut" is a novel dry release technique for NanoCoil fabrication. A known Smart Cut™ process (G. K Celler and S Cristoloveanu, "Frontiers of Silicon-on-Insulator" J. Applied Physics: Volume 93, no. 9, May 2003, the contents of which are hereby incorporated) exists which is utilized for standard silicon-on-insulator wafer fabrication, however has not been applied to circuitry.

Smart Cut™ involves implanting a light gas atom (H or He) to a specific depth precisely controlled by the implant energy. After wafer bonding to a handle wafer and heat treatment, the thin surface layer of the implanted wafer cleaves uniformly along a parallel plane to the surface, due to cracks formed by accumulation of the buried gas. After cleaving the thin, uniform surface slice is effectively transferred to the handle wafer.

Figure 36:
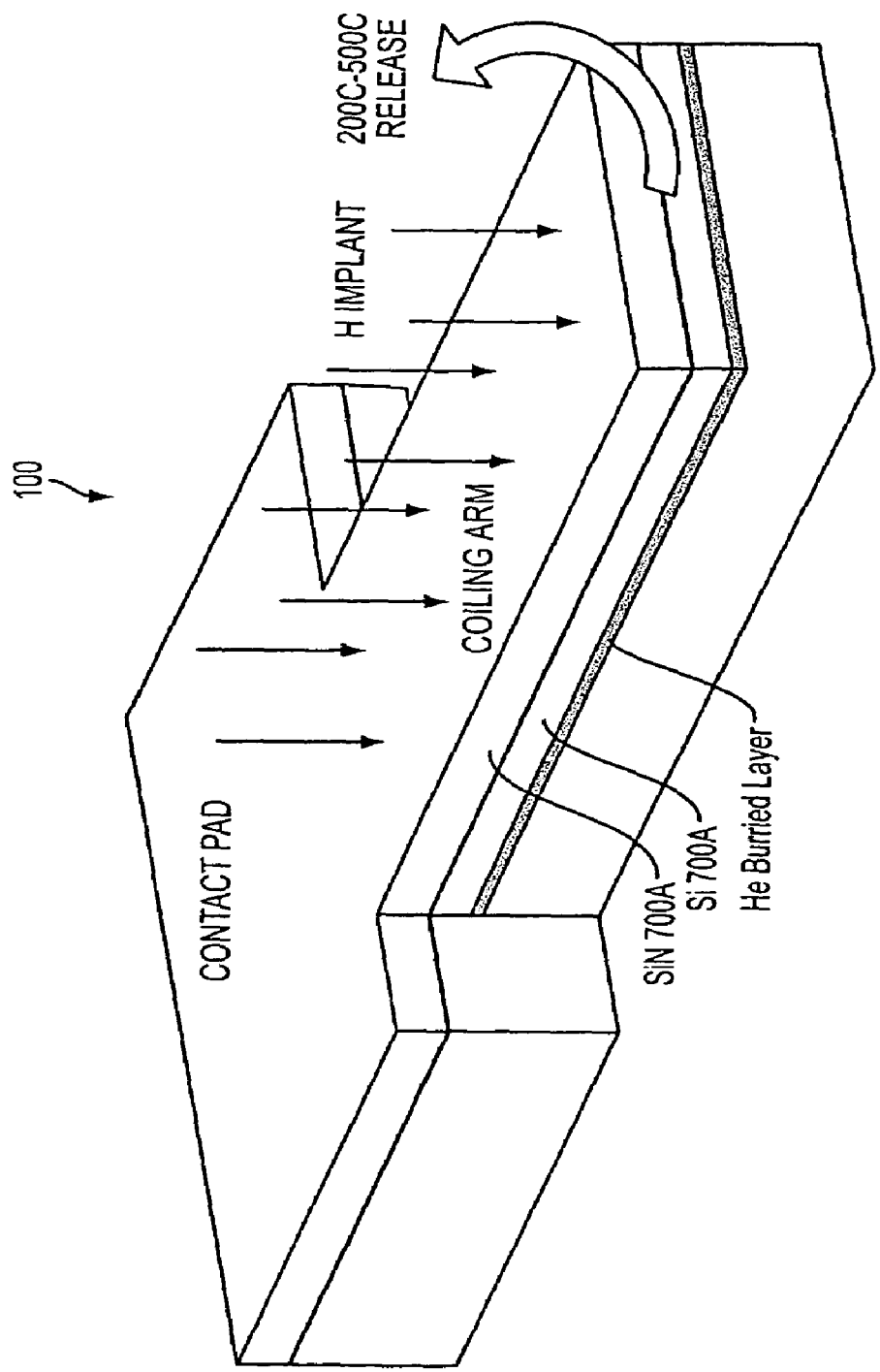
FIG. 36 illustrates an exemplary dry release technique of the present invention.

The Selective Smart Cut process, illustrated in FIG. 36, also utilizes a cleavage plane layer formed by implantation of a light gas. However, in Selective Smart Cut, the wafer is patterned with a masking photo-resist, which allows the cleavage plane to form in selected areas on the wafer. In the figure, a 700A stressed nitride layer was first deposited and etched to form a mesa structure. The mesa structure is important because it provides a free surface for the lateral crack on which to terminate and it provides a path for the buried gas to escape, potentially reducing surface blistering. Next, the light gas is implanted through the surface to a depth of 700A below the nitride/Si interface. This implant is patterned such that it only occurs in the coiling arm region of the mesa structure.

After thermally annealing the silicon uniformly cleaves, allowing the stressed nitride to act on the released Si layer inducing a coiling action. The released bi-layered structure will stop coiling at the unimplanted contact pad because the cleavage plane is not formed in this region. This Selective Smart Cut technique is extremely useful in the efficient fabrication of NanoCoil structures because it allows large area releases without the need for wet etch species to laterally undercut large dimensions, a process that could become very slow for large area devices. Furthermore the release can be performed at relatively low temperatures (200-500C), which are consistent with many contact metallization schemes.

When fabricating coiled memory, logic devices may be fabricated, possibly on a separate, control wafer or together with the memory circuits on the same wafer, to control input and read-out from the memory circuits. If side-type extension contacts are used, spiral via patterns can be etched into the control wafer with each via corresponding to the positions of the side extension contacts of the coiled memory device. Standard semiconductor metal lines may be used to interconnect the vias to the control logic circuitry.

The embodiments of the present invention are adaptable to numerous novel applications. For example, the invention can provide a better, more efficient design for radiation resistant circuitry (e.g., Rad-Hard). Metal shielding is typically added to circuitry to provide protection from radiation, such as in outer-space applications.

Figure 25A:
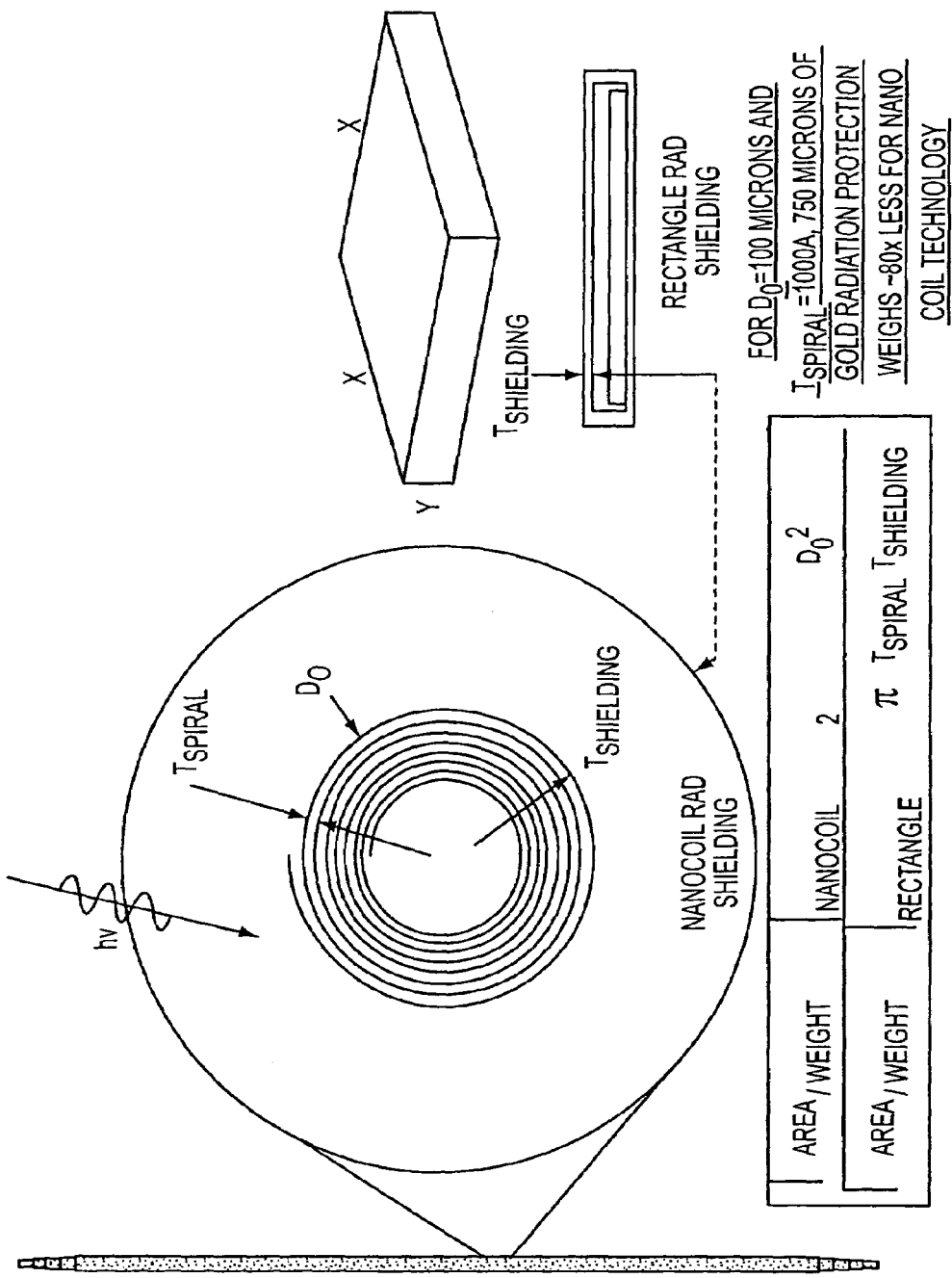

As shown in FIGS. 25a-d, the preferred embodiments are capable of providing lower weight and lower cost circuitry for high-radiation applications. In FIGS. 25a and 25b, it is shown how the geometry of the present requires far less shielding for such applications. In particular, traditional cubical or box shaped technology must use much more shielding than a cylindrical shaped circuit. Therefore, the present invention provides lower size and weight circuit solutions for aerospace applications.

Figure 25C:
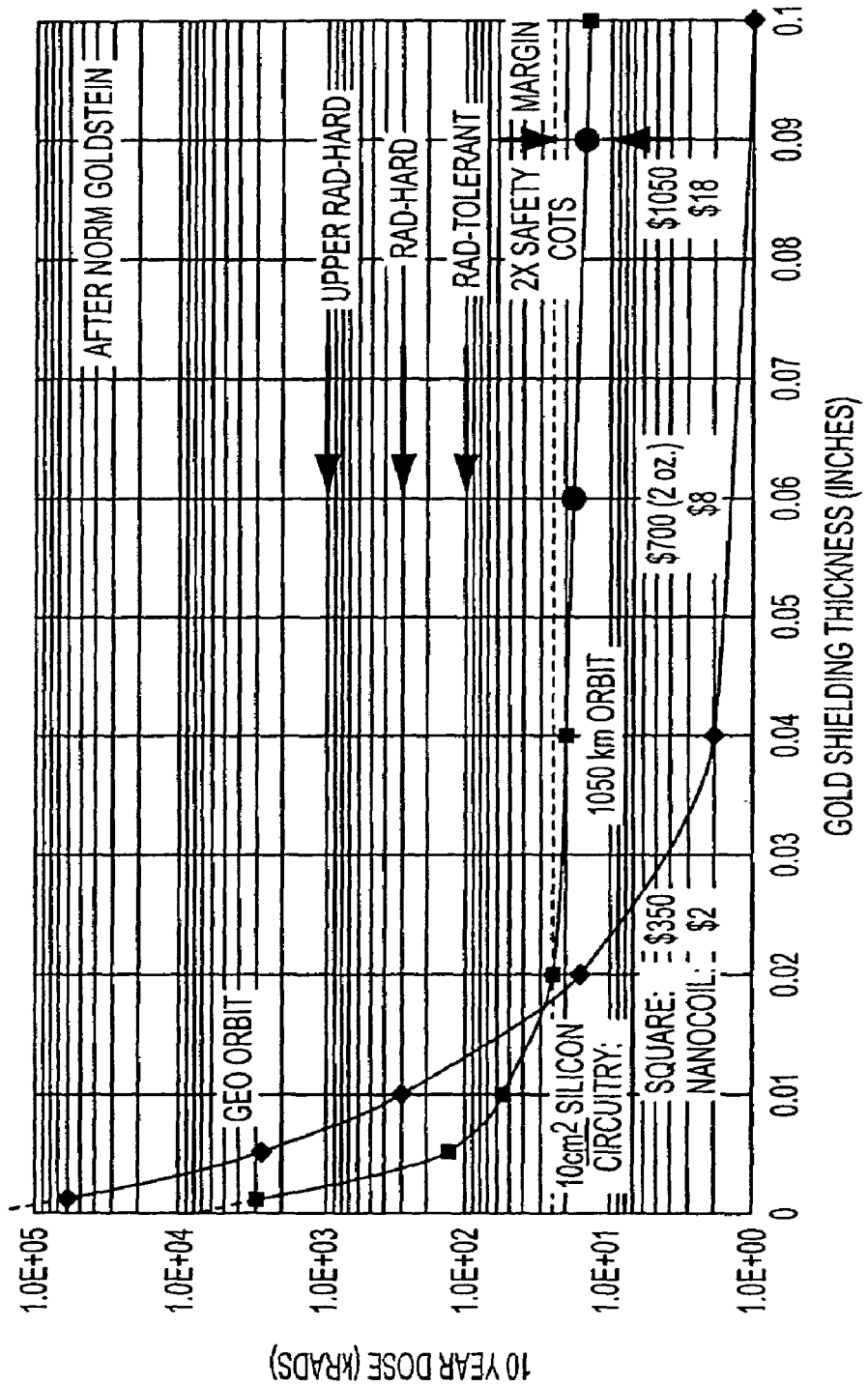
FIGS. 25c-d are graphs showing cost and weight of radiation shielding for different memory devices.
Figure 25D:
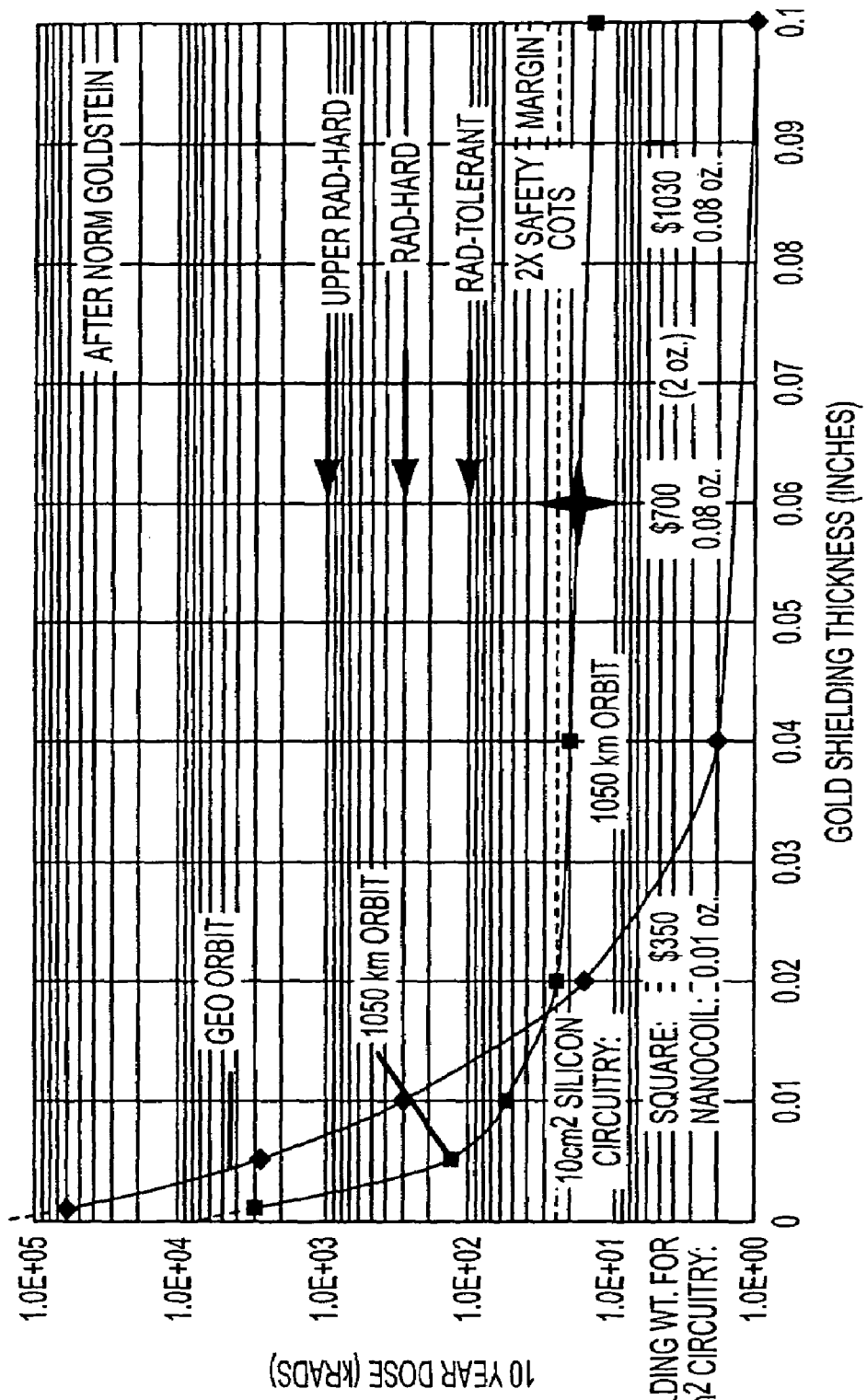

In FIGS. 25c and 25d, one can see that the cost savings is tremendous given the high cost of gold. For example, a memory device designed for use in orbit in space at 1050 km for 10 years typically requires 0.09 inches of gold shielding. The geometry of the preferred embodiments requires far less total gold shielding than conventional designs. In the present example, given the current cost of gold, the device may be encased in gold shielding for approximately $18 for this case, as compared to $1050 for a conventional memory device.

Perhaps more importantly, the weight of the gold shielding can be 50 times to 200 times less, important in space satellites. In the example shown in 25d, for a 10 year 1050 km orbit, for the same amount of memory (flat 10 square centimeter circuit area), the conventional memory device requires 2 oz of gold shielding while the device of the present invention only requires 0.04 oz of gold: a weight savings in space of 50:1. This is extremely important because in the case of space applications, the cost savings associated with the weight exceeds the cost savings associated with manufacturing the device itself.

Figure 26B:
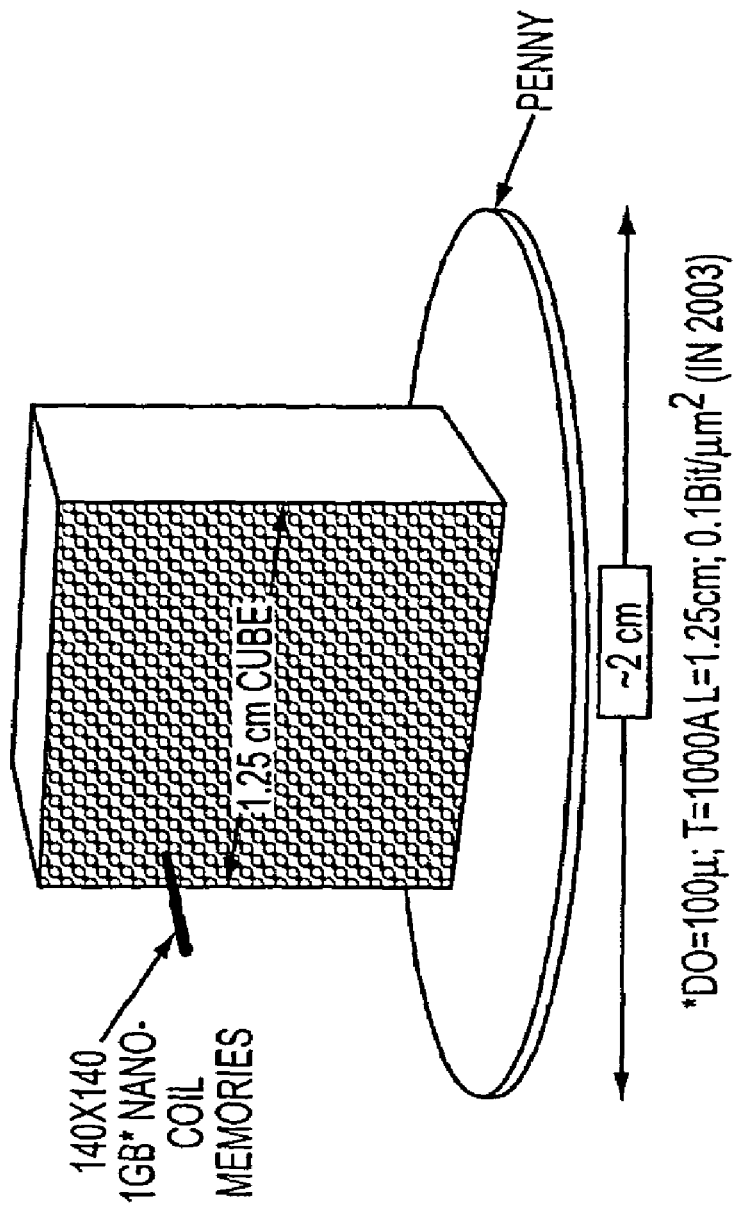

High-density memory cubes can be fabricated by assembling any number of coiled memory devices. As shown in FIGS. 26a and 26b, using devices 100 having a pyramid contact scheme 300, a 20 terabyte memory cube 2600 can be assembled into a box 1.25 cm cubed. Multiplexers (not shown) may be used to simplify integration of a number of coiled memory devices. Each coiled memory device 100 can be spaced to accommodate any desired circuit board design. For example, top and bottom layered circuit boards can be used with contact designs similar to those shown in FIG. 4.

Figure 27:
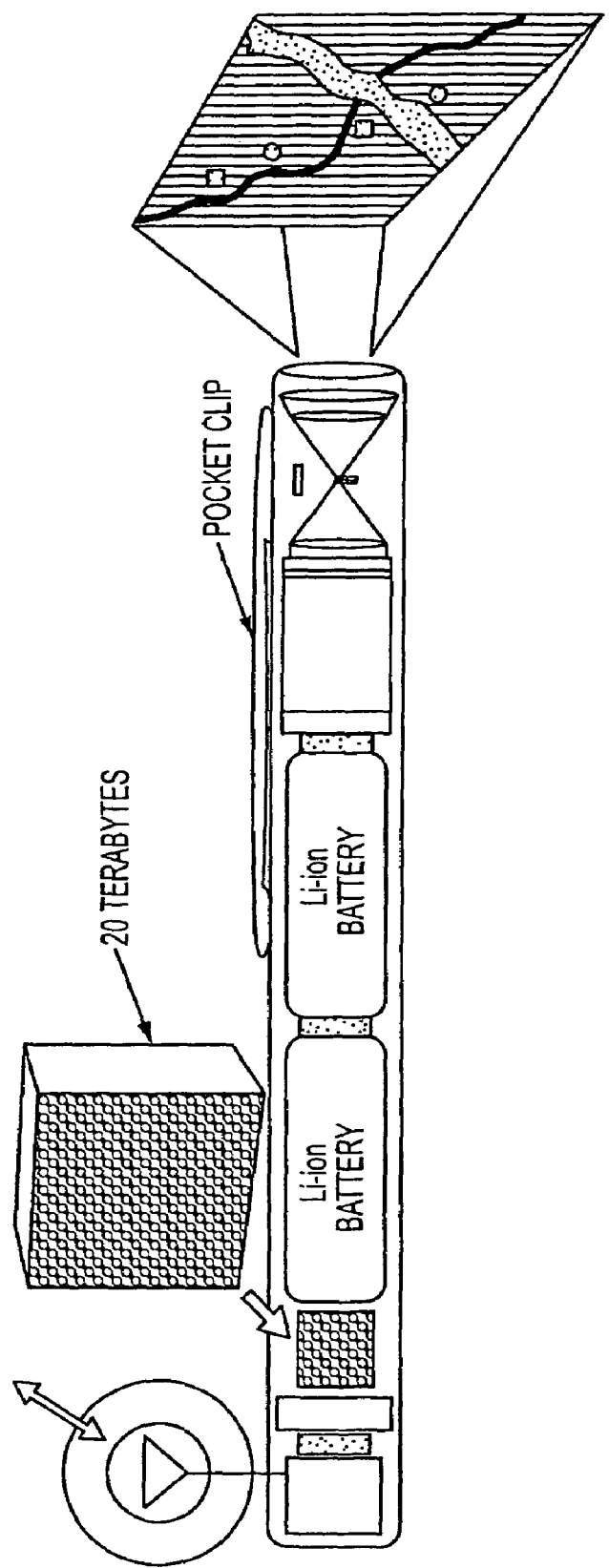
FIG. 27 shows a memory cube utilized in a pen projector.

The small size and shape of the coiled memory devices of the preferred embodiments are especially adaptable for use in small electronic devices or extremely lightweight applications. For example, a pen projector is shown in FIG. 27. Previously, it was unfeasible to provide a pocket sized pen device that could include terabytes of memory. In such a device utilizing the present invention, a very large number of Web Sites (possibly a million plus) can be stored into the memory, and also including an appropriate Search Engine, such that the pen projector can be operated as a 'Wireless Web Searcher', able to find over a million Web Sites without resort to wire-based communication.

Figure 28:
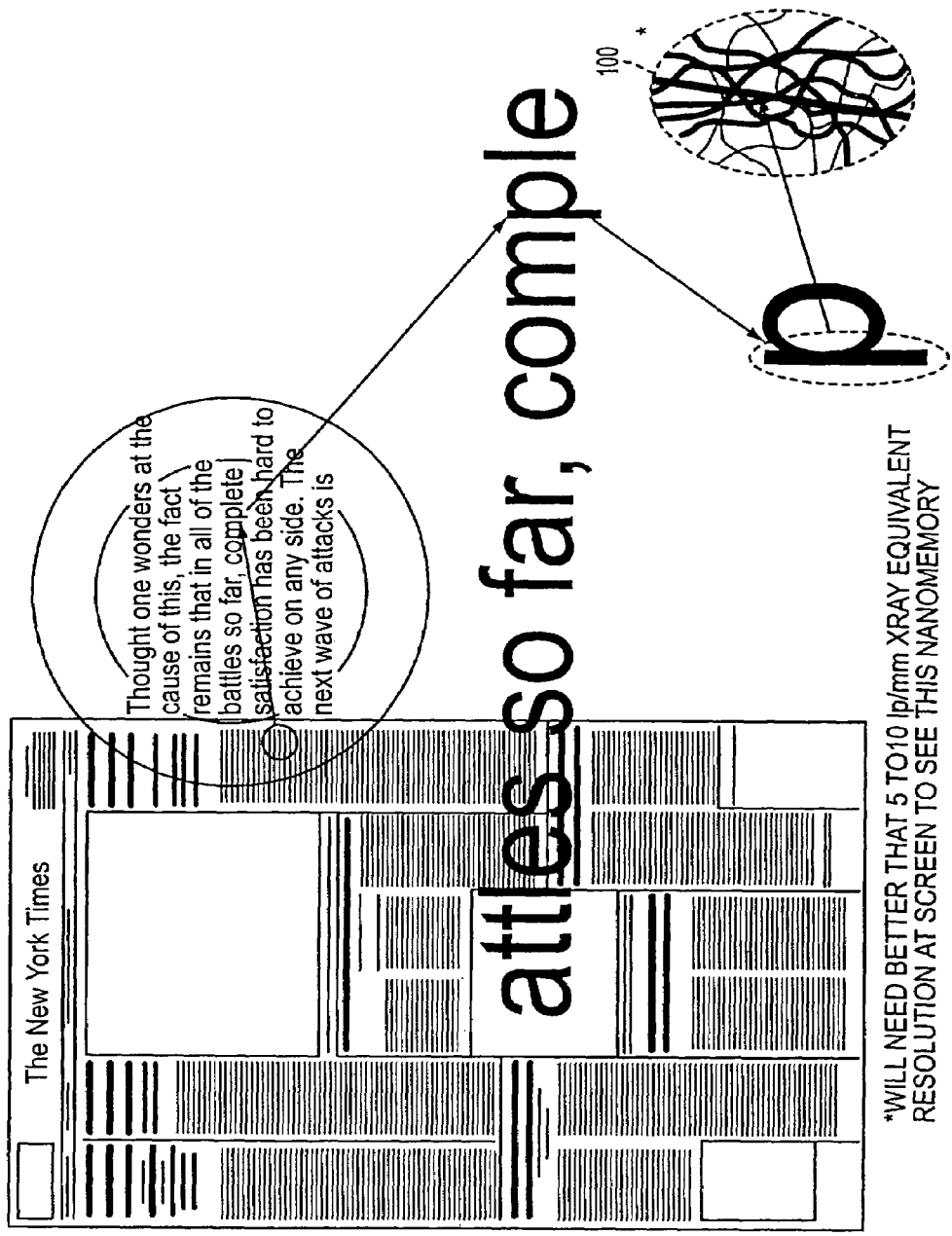
FIG. 28 illustrates a coiled memory device embedded into a newspaper.

In FIG. 28, it is illustrated how hidden memory may be embedded in an every day commodity, such as a newspaper. The coiled memory device of the preferred embodiments can be so small, that it could be embedded or woven into a typed letter on paper. As shown, a single coil 100 is hidden in the letter 'P', in a piece of paper.

As should be realized, the present invention allows for vast improvements over the prior art. Referring to FIG. 37, using a metric of density-speed product, embodiments of the present invention will be capable of improvements on the order 56 million times over prior art magnetic disk devices and over 1,000 times over state of the art flash memory. The figures for the nanocoil device shown in the chart assume average address line lengths along the length of a device. However, many of the embodiments of the present invention described above can reduce line length and therefore, could achieve read/write speeds (i.e., and therefore the density-speed product as well) in considerable excess of that shown here. Of course, the inclusion of the chart in FIG. 37 is not meant to be limiting and coiled memory device could be made faster or slow, larger or smaller than listed.

Thus, a number of preferred embodiments have been fully described above with reference to the drawing figures. Although the invention has been described based upon these preferred embodiments, it would be apparent to those of skilled in the art that certain modifications, variations, and alternative constructions would be apparent, while remaining within the spirit and scope of the invention.

For example, the coiling layer could be selected from other materials whose characteristics could effect coiling while the sacrificial layer is removed. Additionally, although the invention has been described in terms of memory devices, the present invention is certainly adaptable to coil many other types or circuits. Furthermore, although silicon (MOS) memory circuits were described, other types of coiled circuits are contemplated, such as, e.g. radio frequency (RF) devices, GaAs and GaAs circuitry, silicon microprocessors and other analog and digital circuitry.

We claim:

1. A coiled circuit device comprising:
   a flexible, integrated circuit layer comprising at least one circuit, wherein said integrated circuit layer is in tension; and
   a coiling layer formed onto a surface of said integrated circuit layer, wherein said coiling layer is in compression;
   wherein said integrated circuit layer and said coiling layer are coiled.

2. The coiled circuit device as recited in claim 1, further comprising external connectors connected with said integrated circuit layer.

3. The coiled circuit device of claim 2, wherein said external connectors comprise a pad disposed on a first edge of said integrated circuit layer.

4. The coiled circuit device as recited in claim 1, wherein said integrated circuit layer comprises a MOS memory circuit layer.

5. The coiled circuit device as recited in claim 4, wherein said integrated circuit layer further comprises I/O circuitry for read and write access to said memory circuit layer.

6. The coiled circuit device as recited in claim 5, further comprising electrical contactors on at least one peripheral edge of said integrated circuit layer.

7. The coiled circuit device as recited in claim 1, further comprising an insulation layer deposited upon said integrated circuit layer.

8. The coiled circuit device as recited in claim 1, further comprising electrical contactors on at least one peripheral edge of said integrated circuit layer.

9. A coiled circuit device produced by a process comprising the following steps:
 forming an integrated circuit layer onto a substrate, said integrated circuit layer comprising at least one circuit, wherein said integrated circuit layer is in tension;
 forming a coiling layer on a surface of said integrated circuit layer, wherein said coiling layer is in compression; and
 releasing said integrated circuit layer from said substrate such that said integrated circuit layer and said coiling layer coils, wherein said integrated circuit layer is flexible when released from said substrate.

10. The coiled circuit device as recited in claim 9, wherein said integrated circuit layer comprises a memory circuit layer.

11. The coiled circuit device as recited in claim 10, wherein said integrated circuit layer further comprises I/O circuitry for read and write access to said memory circuit layer.

12. The coiled circuit device as recited in claim 11, further comprising electrical contactors on at least one peripheral edge of said integrated circuit layer.

13. The coiled circuit device as recited in claim 9, further comprising electrical contactors on at least one peripheral edge of said integrated circuit layer.

14. A device sheet, comprising:
 a nitride coiling layer in compression; and
 a flexible, integrated circuit device layer in tension positioned on said coiling layer, wherein said integrated circuit device layer comprises at least one circuit.

15. The device sheet of claim 14, wherein said device sheet has a cross section varying in a repeated fashion along an axis in a coiling direction.

16. The device sheet of claim 14, where said sheet is less than 1000 angstroms thick.

17. The device sheet of claim 14, wherein said integrated circuit device layer comprises thin CMOS circuitry.

18. The device sheet of claim 17, wherein said thin CMOS circuitry comprise X-Y address conductors comprising metal having a thickness of 25 angstroms or less.

19. The device sheet of claim 14, further comprising upper and lower outer insulator layers.

20. The device sheet of claim 19, where said upper and lower outer insulator layers comprise a conductive metal.

21. The device sheet of claim 19, where said upper and lower outer insulator layers comprise a conductive metal selected from a group consisting of aluminum, copper and gold.

22. The device sheet of claim 14, further comprising electrical contacts that provide I/O to said integrated circuit device layer.

23. The device sheet of claim 22, wherein said electrical contacts comprise a pad disposed on a first edge of said integrated circuit device layer.

24. A coiled silicon circuit device having a density speed product of at least $1 \times 10^{20}$ bits per cubic centimeter seconds.

* * * * *